(12) United States Patent
Kinoshita et al.

(10) Patent No.: US 11,041,723 B2
(45) Date of Patent: Jun. 22, 2021

(54) SENSOR UNIT, ELECTRONIC APPARATUS, AND MOVING BODY

(71) Applicant: Seiko Epson Corporation, Tokyo (JP)

(72) Inventors: Yusuke Kinoshita, Minowa (JP); Masayasu Sakuma, Shiojiri (JP)

(73) Assignee: Seiko Epson Corporation

(*) Notice: Subject to any disclaimer, the term of this patent is extended or adjusted under 35 U.S.C. 154(b) by 0 days.

(21) Appl. No.: 16/729,614

(22) Filed: Dec. 30, 2019

(65) Prior Publication Data
US 2020/0132460 A1    Apr. 30, 2020

Related U.S. Application Data

(62) Division of application No. 15/325,399, filed as application No. PCT/JP2015/003525 on Jul. 13, 2015, now Pat. No. 10,551,194.

(30) Foreign Application Priority Data

Jul. 16, 2014   (JP) ................................. 2014-145671
Dec. 19, 2014   (JP) ................................. 2014-257001
Jul. 8, 2015    (JP) ................................. 2015-136741

(51) Int. Cl.
*G01D 11/24*      (2006.01)
*G01C 19/5783*    (2012.01)
(Continued)

(52) U.S. Cl.
CPC ........ *G01C 19/5783* (2013.01); *B81B 7/0016* (2013.01); *G01D 11/245* (2013.01);
(Continued)

(58) Field of Classification Search
CPC .. G01D 11/24; G01D 11/245; G01C 19/5783; G01P 1/023; G01P 15/125; G01P 15/123; G01P 15/18; G01P 15/0802
See application file for complete search history.

(56) References Cited

U.S. PATENT DOCUMENTS 6,093,576 A    7/2000  Otani
2006/0266117 A1  11/2006  Ino
(Continued)

FOREIGN PATENT DOCUMENTS

CN    101796374 A    8/2010
EP    2187168 A1     5/2010
(Continued)

OTHER PUBLICATIONS

Extended European Search Report for Application No. EP 15822656 dated Feb. 2, 2018 (9 pages).

*Primary Examiner* — Jamel E Williams

(74) *Attorney, Agent, or Firm* — Harness, Dickey & Pierce, P.L.C.

(57) ABSTRACT

A sensor unit with high reliability and stable detection accuracy against vibrations of an installation target object is to be provided.

A sensor unit includes: a sensor module configured including a substrate with inertial sensors mounted thereon, and an inner case in which the substrate is installed; and an outer case accommodating the sensor module. A recessed part is formed in the inner case. The inertial sensors are arranged in an area overlapping with the recessed part as viewed in a plan view seen from the direction of thickness of the substrate, and a filling member is provided to fill a space formed by the substrate and the recessed part. The sensor module is joined to a bottom wall of the outer case via a joining member.

20 Claims, 21 Drawing Sheets

(51) Int. Cl.
  *G01P 15/18* (2013.01)
  *G01P 1/02* (2006.01)
  *G01P 15/12* (2006.01)
  *B81B 7/00* (2006.01)
  *G01P 15/08* (2006.01)
  *G01P 15/125* (2006.01)

(52) U.S. Cl.
  CPC .......... *G01P 1/023* (2013.01); *G01P 15/0802* (2013.01); *G01P 15/123* (2013.01); *G01P 15/125* (2013.01); *G01P 15/18* (2013.01)

(56) References Cited

U.S. PATENT DOCUMENTS

| | | |
|---|---|---|
| 2008/0257044 A1 | 10/2008 | Watanabe et al. |
| 2009/0120186 A1 | 5/2009 | Matsunuma |
| 2009/0260226 A1 | 10/2009 | Tinguely et al. |
| 2009/0282915 A1 | 11/2009 | Ohta et al. |
| 2011/0036167 A1 | 2/2011 | Ohkoshi et al. |
| 2012/0018611 A1 | 1/2012 | Ishii et al. |
| 2012/0304765 A1* | 12/2012 | Sakuma ............... G01P 1/026 73/488 |
| 2012/0304768 A1* | 12/2012 | Sakuma ............ G01C 19/5783 73/504.12 |
| 2012/0307459 A1* | 12/2012 | Sakuma ............... G01D 11/30 361/728 |
| 2013/0014578 A1* | 1/2013 | Sakuma ............... G01D 11/245 73/431 |
| 2013/0014581 A1* | 1/2013 | Sakuma ............ G01C 19/5783 73/488 |
| 2013/0319113 A1 | 12/2013 | Mizuta |
| 2013/0327143 A1* | 12/2013 | Kinoshita ........... G01C 25/005 73/504.02 |
| 2014/0020466 A1 | 1/2014 | Ohkoshi et al. |
| 2014/0347823 A1* | 11/2014 | Kinoshita ........... B23K 1/0016 361/748 |
| 2014/0352430 A1 | 12/2014 | Ohkoshi et al. |
| 2015/0040666 A1* | 2/2015 | Saito ....................... G01P 1/023 73/514.01 |
| 2016/0030808 A1* | 2/2016 | Uchida .............. G09B 19/0038 482/8 |
| 2017/0343572 A1 | 11/2017 | Ohkoshi et al. |
| 2019/0320526 A1* | 10/2019 | Sato .................... H05K 1/0271 |

FOREIGN PATENT DOCUMENTS

| | | |
|---|---|---|
| EP | 2538175 A1 | 12/2012 |
| JP | H04-32254 A | 2/1992 |
| JP | H06-273224 A | 9/1994 |
| JP | H10-178264 A | 6/1998 |
| JP | 2003-028647 A | 1/2003 |
| JP | 2004-279373 A | 10/2004 |
| JP | 2006-194681 A | 7/2006 |
| JP | 2006-284551 A | 10/2006 |
| JP | 2006-329960 A | 12/2006 |
| JP | 2008-076222 A | 4/2008 |
| JP | 2008-212751 A | 9/2008 |
| JP | 2009-258012 A | 11/2009 |
| JP | 2009-264820 A | 11/2009 |
| JP | 2010-181392 A | 8/2010 |
| JP | 2011-050435 A | 3/2011 |
| JP | 2012-251802 A | 12/2012 |
| JP | 2012-251803 A | 12/2012 |
| JP | 2013-019745 A | 1/2013 |
| JP | 2013-019746 A | 1/2013 |
| JP | 2013-019825 A | 1/2013 |
| JP | 2013-253792 A | 12/2013 |
| JP | 2015-034755 A | 2/2015 |
| JP | 2015-072232 A | 4/2015 |
| WO | WO-2011-040233 A1 | 4/2011 |

* cited by examiner

SENSOR UNIT, ELECTRONIC APPARATUS, AND MOVING BODY

CROSS-REFERENCE TO RELATED APPLICATIONS

This application is a divisional application of U.S. patent application Ser. No. 15/325,399, filed on Jan. 10, 2017, which is a U.S. National Phase Application under 35 U.S U.S.C. 371 of International Application No. PCT/JP2015/003525, filed on Jul. 13, 2015, and which claims priority to Japanese Patent Application No. 2014-145671, filed on Jul. 16, 2014; Japanese Patent Application No. 2014-257001, filed on Dec. 19, 2014; and Japanese Patent Application No. 2015-136741, filed on Jul. 8, 2015. The entire disclosures of all of the above applications are incorporated herein by reference.

TECHNICAL FIELD

The present invention relates to a sensor unit, and an electronic apparatus and a moving body that have this unit.

BACKGROUND ART

Traditionally, as a sensor unit equipped with an inertial sensor which detects inertia based on a predetermined detection axis, a sensor unit 91 (device) having a configuration in which an angular velocity sensor 83 is installed inside a box-like case 80, as shown in FIG. 27, is known. More specifically, a configuration in which a substrate 82 with the angular velocity sensor 83 mounted thereon is directly fixed to a bottom surface 81 inside the box-like case 80 is employed. The angular velocity sensor 83 has a comb-drive actuator 84 having a spindle or comb-shaped electrode, formed on a semiconductor substrate using a MEMS (micro electro-mechanical systems) technique, and electrically reads out a motion generated by a Coriolis force that acts when an angular velocity is applied (as a capacitance change, for example).

Meanwhile, such a traditional configuration has a problem that it is susceptible to the influenced of characteristic vibrations (noise vibrations) transmitted from an installation target surface 85 (device) and that their influence on detection accuracy cannot be denied. For example, in the case where the sensor unit 91 is installed in a car navigation system, there is a risk that noise vibrations due to engine operations of the automobile may be directly transmitted from the bottom surface 81 of the case 80 to the angular velocity sensor 83. This is a problem not limited to the package configurations of angular velocity sensors but common to the package configurations of inertial sensors as a whole, such as acceleration sensors.

In view of the foregoing problem, JP-A-2006-194681 proposes the sensor devices shown in FIG. 28 to FIG. 30. A sensor device 92 of FIG. 28 has a configuration in which the case 80 is in an upside-down (vertically inverted) state and in which the substrate 82 including the angular velocity sensor 83 is suspended with metal springs 86 from the bottom surface 81 of the case 80. Meanwhile, a sensor device 93 of FIG. 29 has a configuration in which the substrate 82 including the angular velocity sensor 83 is suspended from an outer peripheral edge of the case 80, using flexible substrates 87. Also, a sensor device 94 of FIG. 30 has a configuration in which a stair-like step 88 is formed at a peripheral edge part inside the case 80 and in which a plurality of bonding wires 89 extends from the step 88 and suspends the substrate 82 including the angular velocity sensor 83. According to this literature, the influence of noise vibrations can be sufficiently attenuated with the configurations of the sensor devices 92 to 94.

However, the sensor devices 92 to 94 of JP-A-2006-194681 have a problem that it is difficult to achieve stable detection accuracy because of low reliability. More specifically, in any of the configurations of the sensor devices 92 to 94, the position of the substrate 82 including the angular velocity sensor 83 is in the state of floating inside the case 80 and therefore the angular velocity sensor 83 tilts by its own weight or due to change with time. As the angular velocity sensor 83 tilts, a bias is applied to the comb-drive actuator 84 because of the influence of gravity, and therefore its influence extends to the detection result, causing low reliability.

Also, in the case of the configuration in which the substrate 82 is suspended with the springs 86, there is a risk that the substrate 82 may vertically vibrate due to the influence of noise vibrations. This vertical vibration, too, may influence the detection result, making it difficult to achieve stable detection accuracy. The sensor devices 93, 94, too, employ the configurations in which the substrate 82 is suspended with elastic members. Therefore, the vibration of the substrate 82 occurs due to the influence of noise vibrations and it is similarly difficult to achieve stable detection accuracy.

SUMMARY

The invention is made to solve at least a part of the foregoing problems and can be implemented in the following application examples or forms.

Application Example A sensor unit includes: an inertial sensor; a sensor module in which the inertial sensor is installed; and an outer case which has a bottom wall and a sidewall in contact with the bottom wall and accommodates the sensor module. The sensor module is joined to the bottom wall of the outer case via a joining member.

According to this configuration, the sensor module is joined to the bottom wall of the outer case via the joining member. Preferably, the sensor module is fitted inside the outer case, and a ring-shaped joining member is arranged along the fitting part so as to join the two components together. The joining member may have an adhesive property and the two components are joined in the state where the joint member is compressed.

Also, the outer case, the joining member, and the sensor module (case part) can be formed with high precision by cutting or with metal molds, and these parts are configured to be placed on top of one another in order and thus assembled together. Therefore, unlike the configurations in which the inertial sensor is suspended as in the related-art technique, the sensor module in which the inertial sensor is installed can be positioned with high precision.

Thus, according to the sensor unit in the application example, since the position of the inertial sensor is stable, reliability is increased. Also, since the vibration-proof joining member is provided, the sensor unit is less susceptible to the influence of noise vibrations and its detection accuracy becomes stable. Therefore, a sensor unit with high reliability and stable detection accuracy can be provided.

Also, it is preferable that the joining member is formed of a material with a lower elastic modulus than the outer case. As described above, preferably, the two components are bonded together using a ring-shaped joining member. Therefore, airtightness can be secured. By thus using a material with a lower elastic modulus for the joining member than the outer case, the joining member functions as a vibration-proof member as well. Therefore, the transmission of noise vibrations from the outer case to the sensor module can be restrained.

Thus, the sensor unit is less susceptible to the influence of the external environment and its reliability can be increased.

Also, it is preferable that the outer case is in the shape of a box in which one side opposite the bottom wall is an opening surface, that the sensor module is accommodated therein in such a way as to close an opening part of the opening surface, that a first joining surface having a shorter distance from the opening surface than a center part is formed at a peripheral edge part of the bottom wall, and that the joining member is arranged in contact with the first joining member.

Also, it is preferable that a height of an exposed surface of the sensor module from an outer surface of the bottom wall is lower than a height of the opening surface of the outer case from the outer surface of the bottom wall.

According to this configuration, when the sensor unit is installed on an installation target surface of an external device or the like, a structure in which only the top surface of the outer case is in contact with the installation target surface is provided. Therefore, noise vibrations propagated to the sensor unit from the external device side can be restrained by the joining member.

Also, it is preferable that the outer case and the sensor module are fastened together by a fastening member inserted from a through-hole provided in the bottom wall.

According to this configuration, the outer case and the sensor module can be firmly fixed by the fastening member. Here, since the joining member is arranged between the outer case and the sensor module, the fastening structure of the outer case and the sensor module by the fastening member achieves the effects of restraining the propagation of noise vibrations from the outer case to the sensor module and improving airtightness.

Also, it is more preferable that the joining member is in contact with the side wall (or the bottom wall or the first joining surface as apart of the bottom wall) of the outer case.

Also, it is preferable that the sensor module includes the inertial sensor, a substrate on which the inertial sensor is mounted, and an inner case in which the substrate is installed, and that a second joining surface overlapping with the joining member is formed at a peripheral edge part on the side opposite the bottom wall, of the inner case.

According to this configuration, since a structure in which the inner case is fitted in a nested state inside the outer case is provided, a small-sized and sturdy package configuration can be realized. Also, since the outer case, the joining member, and the inner case (sensor module) are configured to be placed on top of one another, assembly is easy and manufacturing efficiency is high.

Also, it is preferable that the substrate is bonded to the inner case with an adhesive which is elastic in a solidified state. According to this configuration, the vibration-proof member has a two-stage configuration. Therefore, the influence of noise vibrations can be reduced further and reliability can be increased further.

Also, it is preferable that a connector for connection to an outside is mounted on the substrate and that an opening part is formed in the inner case so as to expose the connector to the outside from the opening surface of the outer case.

Also, it is preferable that a recessed part is formed in the inner case, that the inertial sensor is arranged in an area overlapping with the recessed part as viewed in a plan view seen from a direction of thickness of the substrate, that a filling member is provided to fill a space formed by the substrate and the recessed part, and that the sensor module is joined to the bottom wall of the outer case via the joining member.

According to this configuration, in the sensor module formed by the substrate with the inertial sensor installed thereon and the inner case, the filling member is provided to fill the space formed by the substrate and the recessed part of the inner case. Thus, by shifting the resonance frequency of the sensor module out of the band of external noise vibrations, the influence of noise vibrations can be reduced. Particularly, in the sensor module, since the inertial sensor is arranged in the area overlapping with the recessed part as viewed in a plan view seen from the direction of thickness of the substrate, the inertial sensor can be made less susceptible to the influence of external noise vibrations.

Thus, a sensor unit which is less susceptible to the influence of noise vibrations and has stable detection accuracy can be provided.

Also, it is preferable that the inertial sensor has at least a part of a body thereof arranged in the space of the sensor module.

In this application example, the body of the sensor module means the main body of the sensor module and refers to the external shape of the sensor module in the state of being installed on the substrate.

According to this configuration, since at least a part of the inertial sensor is covered by the filling member provided to fill the space formed by the substrate and the recessed part, the influence of external noise vibrations on the inertial sensor can be restrained more effectively.

Also, it is preferable that a configuration in which the entire body or a major part of the body of the inertial sensor is arranged in the space formed by the substrate and the recessed part is employed, because it makes the sensor unit much less susceptible to the influence of noise vibrations.

Also, at apart of a peripheral edge of the recessed part, a shelf part that is higher than a recess bottom surface of the recessed part in the direction of thickness of the inner case is formed.

According to this configuration, in the process of assembling the sensor module, when the filling member provided to fill the space formed by the substrate of the sensor module and the recessed part of the inner case becomes greater than the capacity of the space, the excess filling member is accommodated on the shelf part provided at the peripheral edge part of the recessed part. Thus, the excess filling member can be restrained from overflowing to unwanted sites.

Therefore, a sensor unit in which the amount of the filling member filling the recessed part can be easily controlled in the manufacturing process can be provided.

Also, it is preferable that a groove part or a through-hole part opening to the side of the recessed part is formed in an area overlapping with the recessed part as viewed in a plan view seen from the direction of thickness of the substrate.

According to this configuration, in the process of assembling the sensor module, when the filling member provided to fill the space formed by the substrate of the sensor module and the recessed part of the inner case becomes greater than the capacity of the space, the excess filling member is accommodated in the groove part or the through-hole part of the substrate. Thus, the excess filling member can be restrained from overflowing to unwanted sites, and the space formed by the substrate and the recessed part can be filled with the filling member.

Therefore, a sensor unit in which the amount of the filling member filling the recessed part can be easily controlled in the manufacturing process and in which the restraining effect by the filling member on the influence of noise vibrations can be achieved more conspicuously, can be provided.

Also, it is preferable that the joining member is one of rubber, elastomer, porous member, and adhesive. Also, it is preferable that a plurality of the joining members is arranged.

Moreover, it is preferable that a fixing part for fixing to an installation target body is formed on the outer case. Also, it is preferable that a plurality of the inertial sensors is provided, including an acceleration sensor and an angular velocity sensor.

The sensor unit may be installed in an electronic apparatus or a moving body.

DESCRIPTION OF EMBODIMENTS

Figure 1:
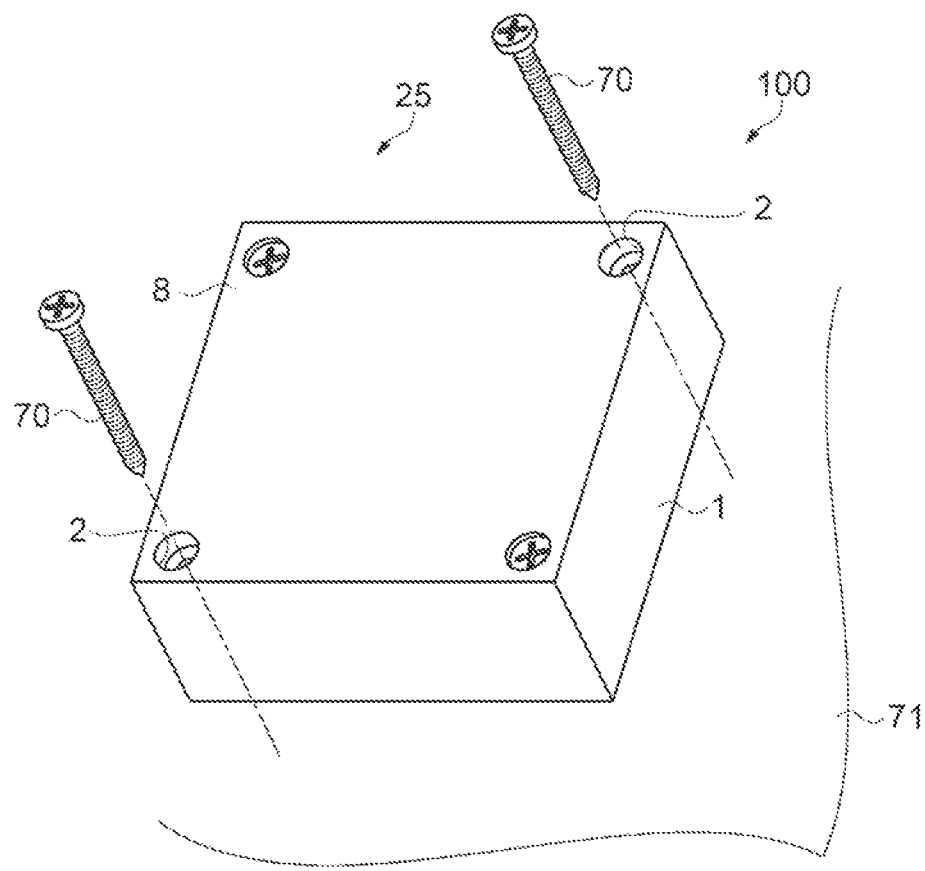
FIG. 1 is a perspective view showing the state where a sensor unit according to Embodiment 1 is fixed to an installation target surface.

Hereinafter, embodiments of the invention will be described with reference to the drawings. In the individual drawings, each layer or each site is not to scale in order to show each layer or each site in a recognizable size in the drawings.

Figure 2:
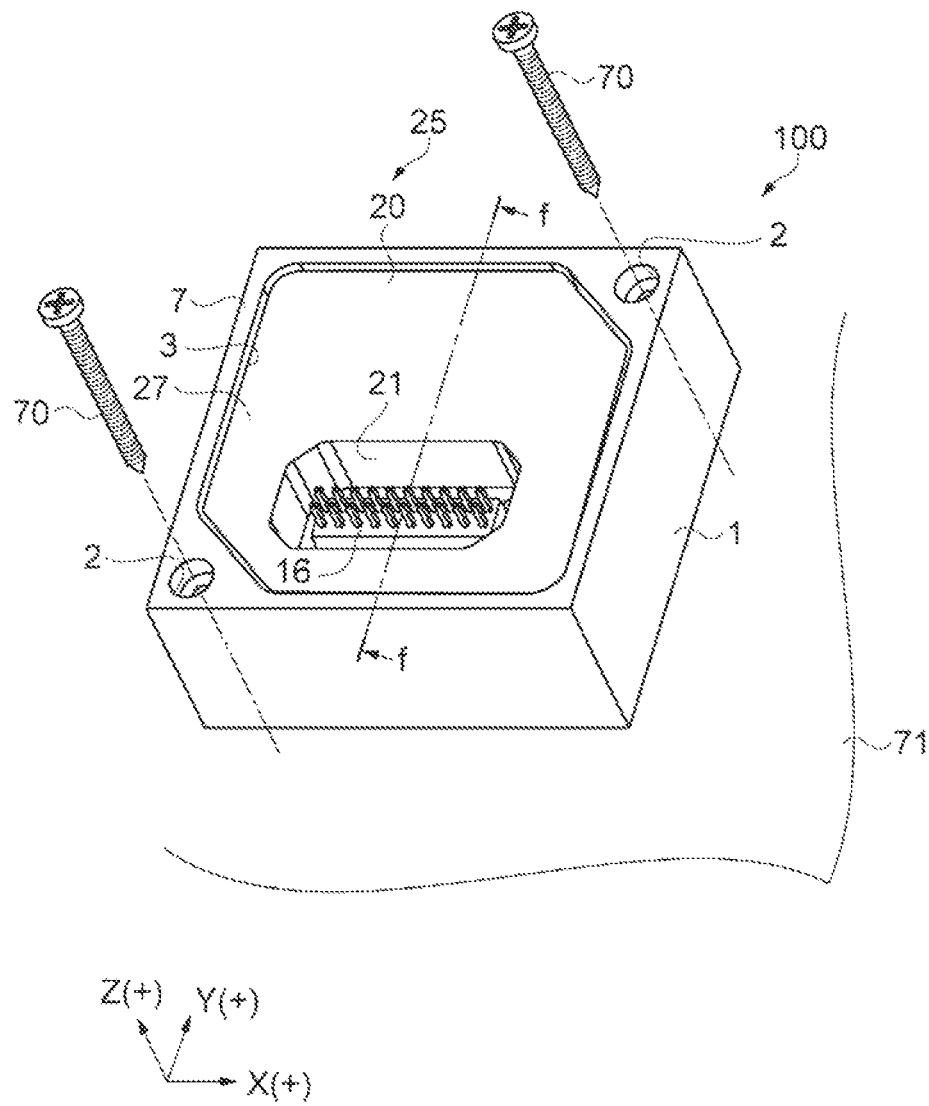
FIG. 2 is a perspective view showing an outline of the sensor unit, as viewed from the installation target surface side in FIG. 1.

Embodiment 1 Outline of Sensor Unit FIG. 1 is a perspective view showing the state where a sensor unit according to Embodiment 1 is fixed to an installation target surface. Also, FIG. 2 is a perspective view showing an outline of the sensor unit, as viewed from the installation target surface side in FIG. 1. First, an outline of a sensor unit 100 according to this embodiment will be described.

In FIG. 1, the sensor unit 100 is an inertial measurement unit (IMU) which detects the attitude or behavior (amount of inertial motion) of a moving body (installation target device) such as an automobile or robot. The sensor unit 100 functions as a so-called six-axis motion sensor having a three-axis acceleration sensor and a three-axis angular velocity sensor.

The sensor unit 100 is a rectangular parallelepiped having a substantially square planar shape, with its size being about 3 cm long on each side of the square and about 1 cm. thick. Screw holes 2 as fixing parts are formed near two vertices situated in a diagonal direction of the square. The sensor unit 100 is used in the state of being fixed to an installation target surface 71 of an installation target body (device) such as an automobile by having two screws 70 passed through these two screw holes 2. Also, the above size is an example, and it is possible to miniaturize the sensor unit 100 to a size installable in a smartphone or digital camera, for example, by selecting components and changing design.

The sensor unit 100 employs a package configuration that is advantageous for restraining noise vibrations such as engine vibrations of an automobile transmitted from the installation target surface 71. With this configuration, higher reliability and stability of detection accuracy than the traditional sensor units are realized. Hereinafter, this advantageous package configuration will be described in detail. However, this configuration is not limited to an IMU having a six-axis motion sensor and can be applied to any unit or device having an inertial sensor.

As shown in FIG. 2, an opening part 21 is formed on the surface as viewed from the installation target surface side of the sensor unit 100. A plug-type (male) connector 16 is arranged inside (on the inner side of) the opening part 21.

The connector 16 has a plurality of pins and the plurality of pins is arranged, extending in a lateral direction, as viewed from the front of FIG. 2. In the description below, the extending direction of the plurality of pins is defined as an X-axis direction. In other words, in the square shape of the sensor unit 100, the extending direction of the sides that lie in the lateral direction as viewed from the front of FIG. 2 is defined as the X-axis direction. Also, the extending direction of the sides in the direction orthogonal to the X-axis direction in the square shape is defined as a Y-axis direction. Then, the direction of thickness of the sensor unit 100 is described as a Z-axis direction.

A socket-type (female) connector (not illustrated) is connected to the connector 16 from an installation target device, and the transmission/reception of electricity for the sensor unit 100 and electrical signals such as detection data is carried out between the two connectors.

<<Configuration of Sensor Unit>>

Figure 3:
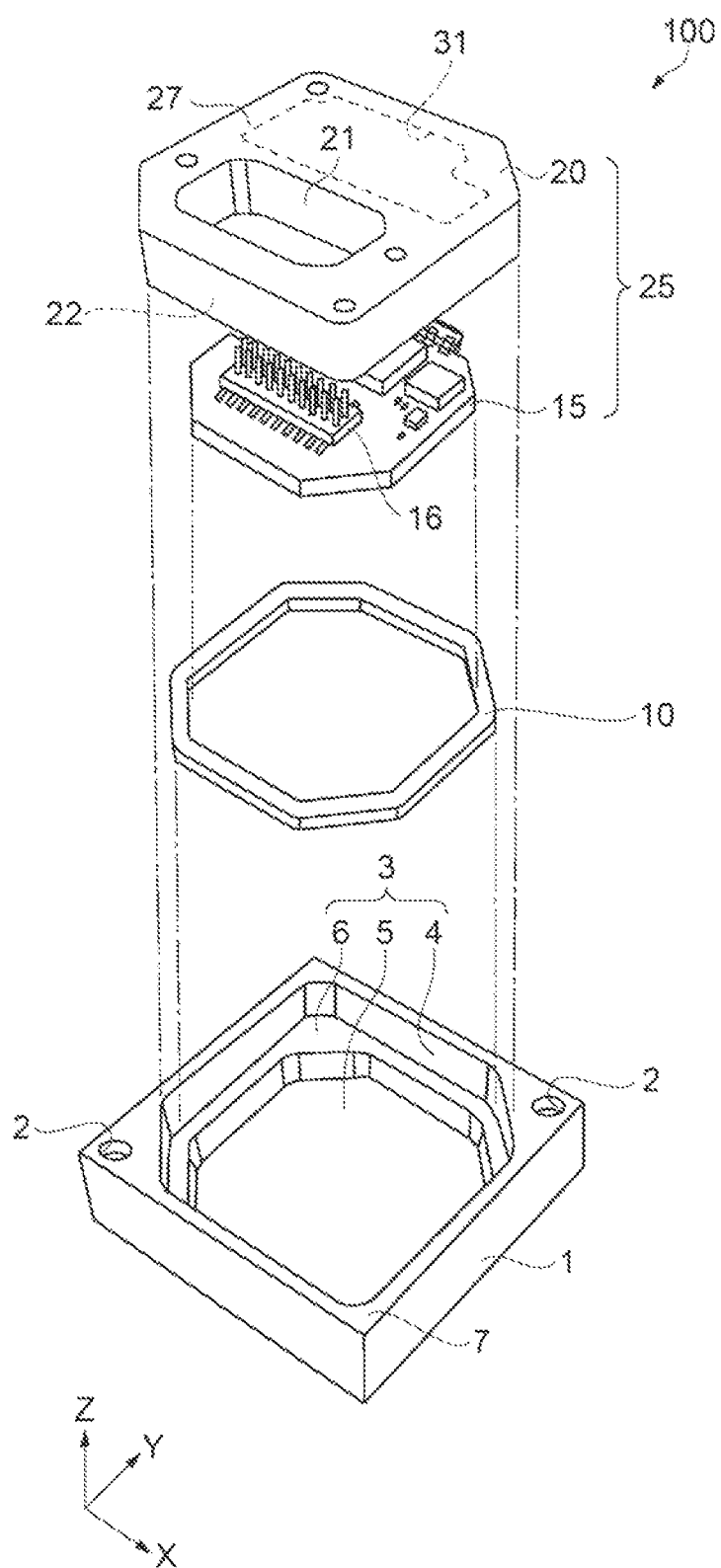
FIG. 3 is an exploded perspective view of the sensor unit, as viewed from the same direction as in FIG. 2.

FIG. 3 is an exploded perspective view of the sensor unit, as viewed from the same direction as in FIG. 2.

Next, the configuration of the sensor unit will be described in detail, mainly referring to FIG. 3 and also referring to FIG. 1 and FIG. 2 when appropriate.

As shown in FIG. 3, the sensor unit 100 is made up of an outer case 1, a joining member 10, and a sensor module 25 or the like. In other words, the sensor unit 100 has a configuration in which the sensor module 25 is fitted (inserted) in an inside 3 of the outer case 1 via the joining member 10. The sensor module 25 is made up of an inner case 20 and a substrate 15. While the outer case and the inner case are used as the names of parts in order to facilitate the understanding of the description, these parts may be referred to instead as a first case and a second case.

The outer case 1 is a pedestal sliced out of aluminum into a box-shape. The material is not limited to aluminum, and other metals such as zinc or stainless steel, a resin, a composite material of metal and resin, or the like, maybe used. The outer shape of the outer case 1 is a rectangular parallelepiped with a substantially square planar shape, and screw holes 2 are formed near two vertices situated in a diagonal direction of the square, similarly to the above-described overall shape of the sensor unit 100. However, these parts are not limited to the screw holes 2. For example, a cut-out that can be screwed with a screw (a structure with a cut-out formed in a corner part of the outer case 1 with the screw holes 2) may be formed to provide a configuration to be screwed. Alternatively, a flange (brim) may be formed on the lateral side of the outer case 1 to provide a configuration to screw the flange part. However, in the case where the cut-out hole in the former case is screwed as a fixing part, if the cut-out of the cut-out hole is open more widely than the screw diameter, the screw may shift outward from the cut-out and tilt at the time of screwing. Therefore, there is a risk that the fixing by screwing may easily be canceled or the cut-out hole part of the outer case is deformed or scraped by the shifted screw. Thus, in the case of providing a cut-out hole as a fixing part, it is preferable that the cut-out of the cut-out hole is made smaller than the screw diameter.

The outer case 1 is in the shape of a box having a rectangular parallelepiped outer shape and having no cover, and its inside 3 (inner side) is an internal space (container) surrounded by a bottom wall 5 and a side wall 4. In other words, the outer case 1 is in the shape of a box in which the one side opposite to the bottom wall 5 is an opening surface. The sensor module 25 is accommodated in such a way as to cover most of the opening part of the opening surface (to close the opening part), and the sensor module 25 is in the state of being exposed from the opening part (see FIG. 2). Here, the opening surface opposite to the bottom wall 5 is the same plane as a top surface 7 of the outer case 1. Also, the planar shape of the inside 3 of the outer case 1 is a hexagon formed by chamfering the corners at two vertex parts of a square, and the two chamfered vertex parts correspond to the positions of the screw holes 2. Also, in the cross-sectional shape of the inside 3 (direction of thickness), a first joining surface 6 as a bottom wall that is one step higher than a center part is formed at a peripheral edge part of the inside 3, that is, in the internal space, on the bottom wall 5. That is, the first joining surface 6 is a part of the bottom wall 5, is a one-step stair-like site formed in a ring shape surrounding the center part of the bottom wall 5 along the plane, and is a surface having a shorter distance from the opening surface (same plane as the top surface 7) than the bottom wall 5.

While the example in which the outer shape of the outer case 1 is a box shape that is a rectangular parallelepiped with a substantially square planar shape and with no cover is described, the planar shape of the outer shape of the outer case 1 is not limited to this and may be a polygon such as hexagon or octagon, for example. The corners at vertex parts of the polygon may be chamfered, or a planar shape in which each side is a curve may be employed. Also, the planar shape of the inside 3 (inner side) of the outer case 1 is not limited to the above-described hexagon, either, and may be a quadrate (quadrilateral) such as square, or other polygons such as octagon. Also, the outer shape of the outer case 1 and the planar shape of the inside 3 may be similar figures, or need not be similar figures.

The inner case 20 is a member which supports the substrate 15, and has a shape that can be accommodated in the inside 3 of the outer case 1. More specifically, as viewed in a plan view, the inner case 20 is in the shape of a hexagon formed by chamfering the corners at two vertex parts of a square, and inside this, an opening part 21 as a rectangular through-hole, and a recessed part 31 provided on the surface on the side supporting the substrate 15 are formed. The two chamfered vertex parts correspond to the positions of the screw holes 2 of the outer case 1. In the direction of thickness (Z-axis direction), the inner case 20 is lower than the height from the top surface 7 of the outer case 1 to the first joining surface 6. In a preferred example, the inner case 20, too, is sliced out of aluminum. However, other materials may also be used, as with the outer case 1.

On the back side of the inner case 20 (surface on the side of the outer case 1), a guide pin for positioning the substrate 15 and a support surface (neither of them illustrated) are formed. The substrate 15 is set (positioned and installed) by the guide pin and the support surface, and is bonded to the back side of the inner case 20. Details of the substrate 15 will be described later. A peripheral edge part on the back side of the inner case 20 is a second joining surface 22 made up of a ring-shaped plane. The second joining surface 22 has a shape substantially similar to the first joining surface 6 of the outer case 1 as viewed in a plan view. When the inner case 20 is set in the outer case 1, the two surfaces face each other in the state of sandwiching the joining member 10. Also, the structure of the outer case 1 and the inner case 20 is an example, and the outer case 1 and the inner case 20 are not limited to this structure.

Figure 4:
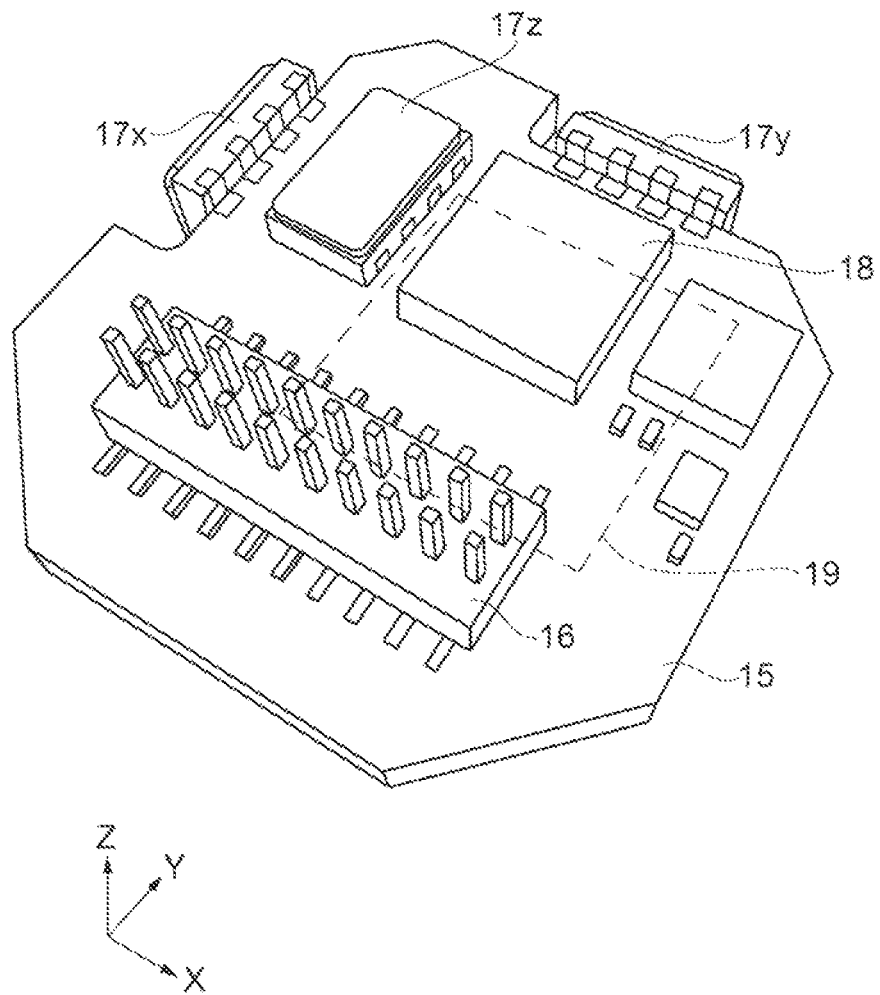
FIG. 4 is a perspective view of a substrate.

Configuration of Sensor Substrate FIG. 4 is a perspective view of the substrate.

Next, the configuration of the substrate 15 with an inertial sensor mounted thereon will be described. The substrate 15 is a multilayer substrate with a plurality of through-holes formed therein and uses a glass epoxy substrate. However, the substrate 15 is not limited to the glass epoxy substrate and may be any rigid substrate on which a plurality of inertial sensors, electronic components, connectors and the like can be mounted. For example, a composite substrate or a ceramic substrate may be used.

On the surface of the substrate 15 (surface on the side of the inner case 20), the connector 16, an angular velocity sensor 17*z*, an acceleration sensor 18 and the like are mounted. The connector 16 is a plug-type (male) connector and has two arrays of connection terminals arranged at an equal pitch in the X-axis direction. Preferably, a total of 20 pins, with each array containing 10 pins, are provided. However, the number of terminals may be changed suitably according to the design specifications.

The angular velocity sensor 17*z* as an inertial sensor is a gyro sensor which detects the angular velocity on the one axis in the Z-axis direction. As a preferred example, an oscillation gyro sensor which uses a quartz crystal an oscillator and detects the angular velocity on the basis of a Coriolis force applied to an oscillating object is used. However, the angular velocity sensor 17*z* is not limited to the oscillation gyro sensor and may be any sensor capable of detecting the angular velocity. For example, a sensor using a ceramic or silicon as an oscillator may be used.

Also, on a lateral side in the X-axis direction of the substrate 15, an angular velocity sensor 17*x* which detects the angular velocity on the one axis in the X-axis direction is mounted in such a way that the mounting surface (installation surface) is orthogonal to the X-axis. Similarly, on a lateral side in the Y-axis direction of the substrate 15, an angular velocity sensor 17*y* which detects the angular velocity on the one axis in the Y-axis direction is mounted in such a way that the mounting surface (installation surface) is orthogonal to the Y-axis. However, without being limited to the configuration using three angular velocity sensors for the respective axes, any sensor capable of detecting the angular velocities on three axes may be used. For example, a sensor device capable of detecting (sensing) the angular velocities on three axes with one device (package) may be used, like the acceleration sensor 18, described later.

The acceleration sensor 18 as an inertial sensor uses an electrostatic capacitance acceleration sensor which is capable of detecting (sensing) the accelerations in the three directions (three axes) of the X-axis, Y-axis and X-axis with one device and in which a silicon substrate is processed by the MEMS technique. However, without being limited to this sensor, and any sensor capable of detecting accelerations may be used. For example, a piezo resistance acceleration sensor or a thermal detection acceleration sensor may be used. Alternatively, a configuration in which one acceleration sensor is provided for each axis maybe used, as in the foregoing angular velocity sensors.

A control IC 19 is mounted on the back side of the substrate 15 (surface on the side of the outer case 1).

The control IC 19 is an MCU (micro controller unit) having a storage unit including a non-volatile memory, an A/D converter and the like, built therein, and controls each part of the sensor unit 100. In the storage unit, a program prescribing the order and contents for detecting the accelerations and angular velocities, a program which digitizes detection data and incorporates the data into packet data, their accompanying data and the like are stored. Also, a plurality of other electronic components is mounted on the substrate 15.

Figure 5:
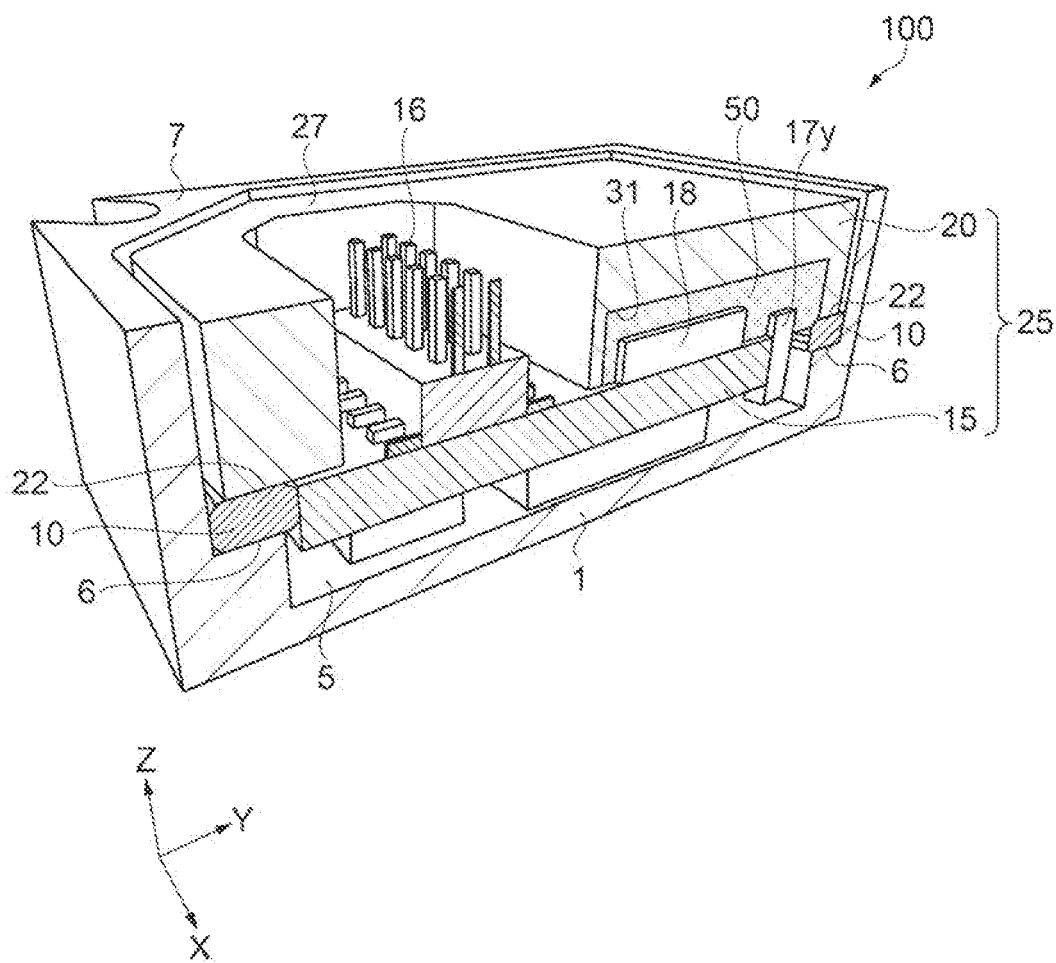
FIG. 5 is a perspective view taken along an f-f cross section in FIG. 2.

Joining Configuration of Each Part FIG. 5 is a cross-sectional perspective view of the sensor unit, taken along an f-f cross section in FIG. 2.

Next, essential parts of the advantageous package configuration of the sensor unit 100 will be described in detail, also referring to FIG. 3 when appropriate.

First, the substrate 15 is bonded to the inner case 20 with an adhesive (not illustrated) which is elastic (flexible) in a solidified state after hardening. As a preferred example, a silicone rubber-based adhesive is used. However, without being limited to the silicone rubber-based adhesive, any adhesive that is more flexible than the outer case 1 in the solidified state may be used, and a normal temperature hardening type, two-part type, thermosetting type, ultraviolet setting type, or composite type of these may be used. For example, these components may be bonded and fixed together using a rubber-based adhesive or hot melt adhesive (glue). Also, since an adhesive is applied without any gap around the connector 16, airtightness (sealing capability) from the outside air (outside) is secured, thus preventing the entry of the outside air into the back side of the substrate 15.

In the space formed by the substrate 15 and the recessed part 31 of the inner case 20, a filling member 50 is provided to fill the space and solidified. As will be described in detail later, the inertial sensors such as the acceleration sensor 18 and the angular velocity sensor 17*y* are arranged in the area overlapping with the recessed part 31 as viewed in a plan view seen from the direction of thickness of the substrate 15, and these are arranged in such a way that a part or the entirety of the bodies of these inertial sensors is covered with the filling member 50. Here, the body of an inertial sensor means the main body of the inertial sensor, and refers to the outer shape of the inertial sensor in the state of being installed on the substrate 15. Also, as the filling member 50, a molding material used for semiconductor packaging or the like can be used. However, from among various types of adhesives such as an adhesive having predetermined elasticity in the solidified state after hardening, similar to the adhesive for bonding the inner case 20 and the substrate 15, an appropriate one corresponding to physical properties such as rigidity of the substrate 15 and physical properties, specifications and the like of the electronic components installed on the substrate 15, such as the inertial sensors, can be used as the filling member 50.

As described above, on the surface of the substrate 15 on the side bonded to the inner case 20, a first area where the connector 16 is arranged and a second area where the plurality of inertial sensors (17*y*, 18 and the like) is arranged, are formed. Then, the part of the substrate 15 around the connector 16 is bonded to the inner case 20 by the adhesive in such a way that, in the first area, the connector 16 is exposed from the opening part of the inner case 20, and that the entry of water and air into the second area is prevented. Also, the second area forms a space with the recessed part 31 of the inner case 20. However, this is not preferable because, when a closed space filled with the filling member 50 is formed, the inertial sensors (17*y*, 18 and the like) receive a compressive stress or the like due to the difference in coefficient of thermal expansion between the filling member 50 and the substrate 15, thus causing output fluctuations. Thus, it is preferable that a communication path which communicates the side of the inner case 20 and the side of the outer case 1 is formed in the second area.

The joining member 10 is a packing (gasket) with a thickness of approximately 1 mm, having a ring-like planar shape along the first joining surface 6 of the outer case 1, as shown in FIG. 3. As a preferred example, a packing with an elliptical cross-sectional shape, formed by a compression molding method using a dedicated metal mold, is employed. Also, the cross-sectional shape may be circular or rectangular. As a preferred example, a self-adhesive packing of silicone rubber is used. This packing is impregnated with a silicone rubber-based adhesive and therefore plays the role of bonding (joining) the first joining surface 6 of the outer case 1 and the second joining surface 22 of the inner case 20. Also, the joining member 10 is not limited to this configuration and may be of any material with a lower elastic modulus than the outer case 1. For example, a rubber or elastomer may be used, and a porous member such as a sponge may be used. Also, a packing may be formed of these materials and an adhesive may be applied at the time of assembly, thus providing adhesiveness. Also, these materials may have a self-bonding property, self adhesiveness or tack property, thus providing adhesiveness. For example, a self-bonding silicone gel sheet can be applied as the joining member 10.

Alternatively, the foregoing adhesive for the substrate 15 may be used. For example, after a thermosetting adhesive is applied to the second joining surface 22 of the inner case 20 by an ink jet method or the like, primary (preliminary) hardening may be carried out to form the joining member 10 in a semi-hardened state, and after the joining member 10 is incorporated in the outer case 1, secondary (main) hardening may be carried out. In a preferred example, the outer case 1 and the inner case 20 both use aluminum with good thermal conductivity, and therefore the joining member 10 can be hardened efficiently even after assembly.

FIG. 5 is referred to again.

As the sensor module 25 (inner case 20) is incorporated into the outer case 1, the state where the joining member 10 is sandwiched between the first joining surface 6 of the outer case 1 and the second joining surface 22 of the inner case 20 is provided. More specifically, the state where the joining member 10 is compressed and slightly crushed by the two surfaces is provided. In other words, the configuration in which the first joining surface 6, the joining member 10 and the second joining surface 22 are placed on top of one another is provided.

Here, between the outer shape of the inner case 20 and the outer case 1, a predetermined gap is formed over its entire perimeter, as shown in FIG. 5. In other words, the inner case 20 and the outer case 1 are joined together via the joining member 10 only. Also, the height of a top surface 27 of the sensor module 25 (inner case 20) is lower than the top surface 7 of the outer case 1. In other words, the inner case 20 is fitted in the outer case 1, like a drop lid in a pot. The settings of the gap and the thickness of the inner case 20 are deliberately defined in the design stage. Details of the height relation between the top surface 27 of the sensor module 25 and the top surface 7 of the outer case 1 in the sensor unit 100, and its effects and the like, will be described later.

Figure 6:
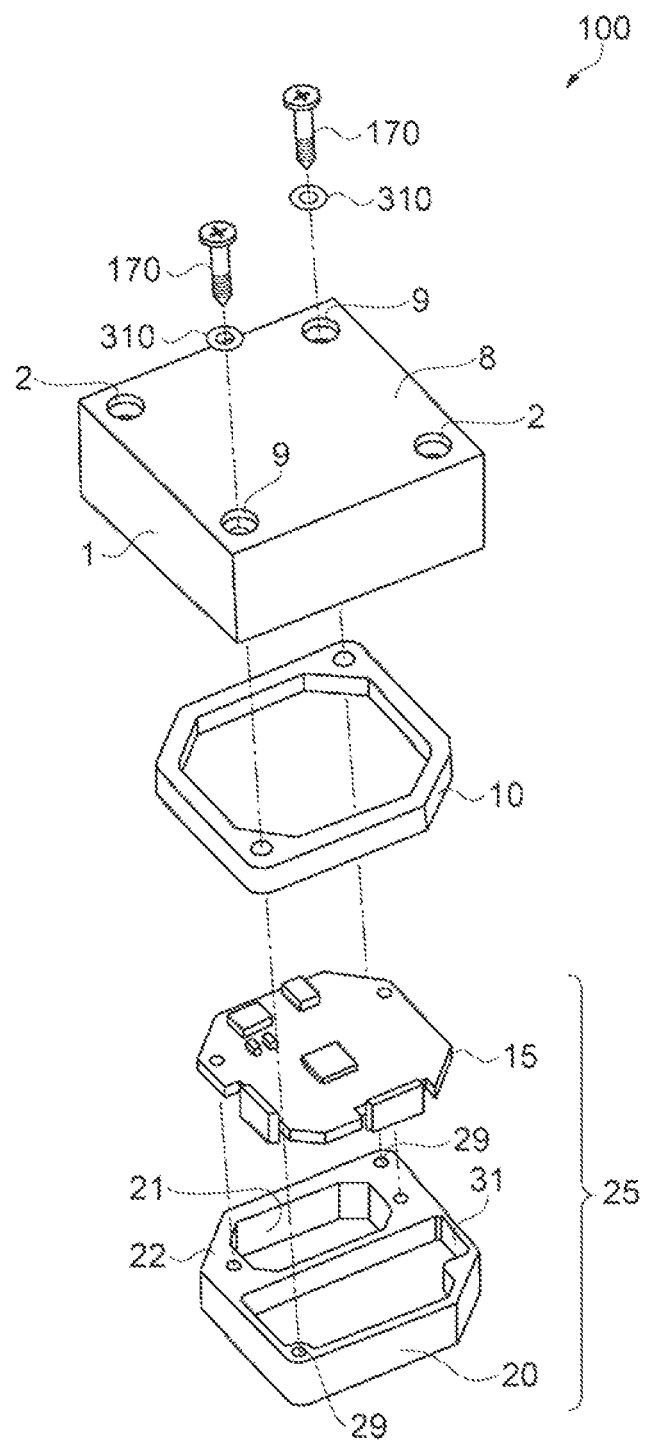
FIG. 6 is an exploded perspective view of the sensor unit, as viewed from the same direction as in FIG. 1.
Figure 7:
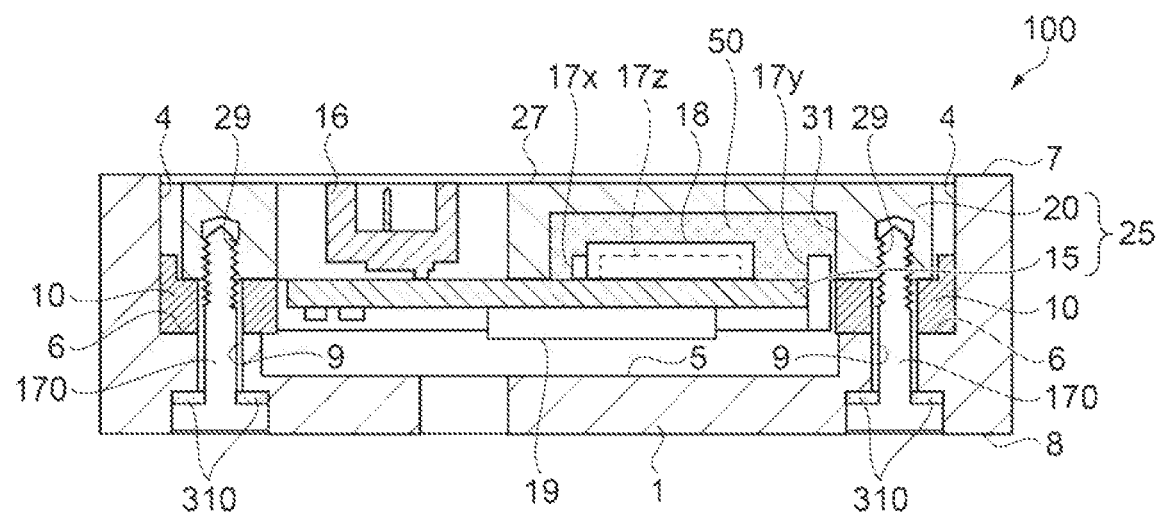
FIG. 7 is a cross-sectional view showing a vibration transmission restraining structure in the sensor unit.

FIG. 6 is an exploded perspective view showing the sensor unit 100 as viewed from the same direction as in FIG. 1. Also, FIG. 7 is a cross-sectional view showing a vibration (noise vibration) transmission restraining structure in the sensor unit 100. Hereinafter, the noise vibration transmission restraining structure or the like provided in the sensor unit 100 in this embodiment will be described in detail, using these drawings.

As shown in FIG. 6, in the sensor unit 100 in which the sensor module 25 made up of the inner case 20 and the substrate 15, and the outer case 1, are fitted together via the joining member, the sensor module 25 and the outer case 1 are fastened (fixed) by screws 170 as fastening members. In this embodiment, two screws 170 are used as fastening members. However, the number of screws 170 is not limited to this. Also, the two screws 170 are inserted in through-holes 9 provided in the outer case 1 from the side of a bottom surface 8, and are screwed and fixed to the inner case 20, sandwiching the joining member 10 and the substrate 15.

Also, in the case where an adhesive of a resin which becomes elastic after solidification is used as the adhesive used to bond the inner case 20 and the substrate 15, the adhesive after solidification is compressed by the screwing with the screws 170, thus increasing airtightness further.

The fastening structure of each part of the sensor unit 100 described above, and the noise vibration transmission restraining structure in the fastening structure will be described in detail below.

In FIG. 7, the through-holes 9 for the screws 170 are provided on the side of the bottom surface 8 of the outer case 1. In this embodiment, two through-holes 9 are provided near opposite angles of the bottom surface 8 of the outer case 1 (see FIG. 6). Through-holes are provided at positions overlapping with the through-holes 9, in the joining member 10, as viewed in a plan view, and screw holes 29 are formed at positions overlapping with the through-holes 9, in the inner case 20, as viewed in a plan view. Then, as the screws 170 as fastening members inserted from the through-holes 9 of the outer case 1 are screwed in the screw holes 29 of the inner case 20, the sensor module 25 is fastened and fixed inside the outer case 1 via the joining member 10 (elastic member). Here, recessed parts accommodating the screw heads of the screws 170 are formed on the side of the bottom surface 8 at the parts where the through-holes 9 are formed, in the outer case 1. In the recessed parts, the screws 170 are inserted in the through-holes 9 of the outer case 1 via elastic members 310. Also, the depth of the recessed parts is set in such a way that the screw heads of the screws 170 in the fastened state do not protrude outward from the bottom surface 8. The elastic members 310 may be a material with a lower elastic modulus than the outer case 1. For example, a rubber or elastomer may be used, and a porous member such as a sponge may be used.

Also, as shown in FIG. 7, in the sensor module 25 having the substrate 15 bonded to the inner case 20, each inertial sensor (17*x*, 17*y*, 17*z*, 18) is arranged in an area overlapping with the recessed part 31 as viewed in a plan view seen from the direction of thickness of the substrate 15. In this embodiment, a part of the entirety of the body of each inertial sensor (17*x*, 17*y*, 17*z*, 18) is arranged in the space formed by the recessed part 31 and the substrate 15. Then, the filling member 50 is provided to fill the space formed by the substrate 15 and the recessed part 31 and is solidified. Here, it is desirable that as large parts as possible of the bodies of the respective inertial sensors (17*x*, 17*y*, 17*z*, 18) and other electronic elements in the space of the recessed part 31 are covered with the filling member 50 filling the space (recessed part space) formed by the substrate 15 and the recessed part 31. In this embodiment, the entire bodies of the angular velocity sensor 17*z* and the acceleration sensor 18, which are laterally placed inertial sensors, are covered with the filling member 50, and approximately a half of the bodies of the angular velocity sensors 17*x*, 17*y*, which are vertically placed inertial sensors, is covered with the adhesive. According to the configuration in which the filling member 50 is provided to fill the space of the recessed part 31 as described above, since a part or the entirety of the substrate 15 and each inertial sensor (17*x*, 17*y*, 17*z*, 18) mounted on the substrate 15 is covered with the filling member 50, the resonance frequency of the entire sensor module 25 is shifted out of the band of external noise vibrations, from the case where there is no filling member 50.

Also, in FIG. 7, the joining member 10 provided between the outer case 1 and the inner case 20 of the sensor module 25 is arranged in contact with the first joining surface 6 as a part of the bottom wall 5 of the outer case 1 and in contact with the side wall 4 rising from the first joining surface 6 (bottom wall 5). That is, the joining member 10 is formed with an L-shaped (crank-shaped) cross section.

Also, as shown in FIG. 7, in the state where the sensor module 25 is housed in the outer case 1, the height of the top surface (that is, the bottom surface of the inner case 20) 27 of the sensor module 25 is lower than the height of the top surface 7 of the outer case 1. In other words, in the sensor unit 100 in the state where the sensor module 25 is housed in the outer case 1, the height of the exposed surface (top surface 27) of the sensor module 25 exposed from the outer case 1, from the outer surface of the bottom wall 5 (bottom surface 8 of the outer case 1), is lower than the height of the opening surface of the outer case 1 (the same plane as the top surface 7) from the outer surface of the bottom wall 5 (bottom surface 8). Also, since the joining member 10 is made up of an elastic member in the configuration shown in FIG. 7, the height of the top surface 27 of the sensor module 25 with respect to the height of the top surface 7 of the outer case 1 can be adjusted by the fastening torque of the screws 170 in the process of assembling the sensor unit 100.

As described above, the sensor unit 100 according to this embodiment can achieve the following effects.

In the sensor unit 100 in this embodiment, in the sensor module 25 including the inner case 20 where the substrate 15 having the various inertial sensors (17$x$, 17$y$, 17$z$, 18) installed thereon is installed, the recessed part 31 is formed in the inner case 20, and each inertial sensor (17$x$, 17$y$, 17$z$, 18) is arranged in the area overlapping with the recessed part 31 as viewed in a plan view seen from the direction of thickness of the substrate 15. Particularly, in this embodiment, a part or the entirety of the body of each inertial sensor (17$x$, 17$y$, 17$z$, 18) is arranged in the space formed by the substrate 15 and the recessed part 31. Then, the configuration in which the filling member 50 is provided to fill the space formed by the substrate 15 and the recessed part 31 and is solidified, is provided.

Thus, each inertial sensor (17$x$, 17$y$, 17$z$, 18) installed on the substrate 15 is covered with the filling member 50 filling the recessed part 31, and the resonance frequency of the sensor module 25 including the substrate 15 and the inner case 20 is shifted out of the band of external noise vibrations, thus enabling a reduction in the influence of external noise vibrations. Thus, since each inertial sensor (17$x$, 17$y$, 17$z$, 18) in the sensor module 25 can be made less susceptible to the influence of external noise vibrations, a sensor unit 100 that can maintain stable detection accuracy even with a detection object having relatively large vibrations can be provided.

Also, the sensor module 25 (inner case 20) is joined to the first joining surface 6, which is a part of the bottom wall 5 of the outer case 1, via the joining member 10. Since the inner case 20 is set to a size such that a predetermined gap is formed over its entire perimeter when incorporated in the outer case 1, the two cases are configured to be joined together via the joining member 10 only.

Here, the joining member 10 is formed of a material with a lower elastic modulus (more flexible) than the outer case 1 and therefore plays the role of absorbing (attenuating) noise vibrations transmitted from the outer case 1. In other words, the joining member 10, as a vibration-proof member with a vibration-proof property, restrains noise vibrations from reaching the inner case 20. Alternatively, it may be paraphrased as a buffer member for reducing noise vibrations. Particularly, an inertial sensor using the MEMS technique is a micro machine having a comb electrode structure or the like, and therefore reacts significantly to vibrations of resonance frequencies particular to the structure, posing a risk that the result of measurement may include noises. However, according to these configurations, noise vibrations can be restrained securely.

Also, the height of the top surface 27 of the sensor module 25 (inner case 20) is lower than the top surface 7 of the outer case 1 and housed in the shape of a drop lid in a pot. Therefore, even in the case of fixing the side of the inner case 20 toward the installation target device, for example, the inner case 20 does not come in contact with the installation target surface. Therefore, the propagation of noise vibrations can be prevented. Thus, a convenient sensor unit 100 that can be used even if its top and bottom (up and down sides) are inverted, can be provided.

Also, according to the sensor unit 100 in the embodiment, the configuration in which the outer case 1 and the sensor module 25 are fastened together with the screws 170 inserted from the through-holes 9 provided in the outer case 1, with the joining member 10 as an elastic member arranged between the outer case 1 and the sensor module 25, and with the elastic members 310 arranged between the screw heads of the screws 170 and the outer case 1, is provided.

According to this configuration, since the joining member 10 and the elastic members 310, which are elastic, are arranged between the outer case 1 and the sensor module 25, the propagation of noise vibrations from the outer case 1 to the sensor module 25 can be restrained more securely in the fastening structure between the outer case 1 and the sensor module 25 with the screws 170.

Also, the joining member 10 is configured in such a way as to be in contact with the first joining surface 6, which is a part of the bottom wall 5 of the outer case 1, and also in contact with the side wall 4 rising from the first joining surface 6. Thus, the propagation of noise vibrations due to the contact of the sensor module 25 with the side wall 4 of the outer case 1 can be restrained. Also, by using the joining member 10 as a positioning guide for the sensor module 25 to the outer case 1 in the assembling process, the effect that work performance in the assembly is improved can be expected.

Moreover, the configuration in which the outer case 1, the joining member 10 and the inner case 20 formed with high precision by cutting or with metal molds are assembled by being placed on top of one another in this order is employed. Therefore, unlike the configuration in which the inertial sensor is in a suspended state as in the related-art technique, the substrate 15 (sensor module 25) with the inertial sensors installed thereon can be accurately positioned. In other words, the positions of the inertial sensors are constantly stable. Also, the configuration in which these are assembled by being placed on top of one another is easy to work on and achieves high manufacturing efficiency.

Thus, according to the sensor unit 100, since the positions of the inertial sensors are stable, its reliability is high, and since the vibration-proof joining member 10 is provided, the sensor unit is less susceptible to the influence of noise vibrations, and detection accuracy becomes stable.

Thus, a sensor unit 100 with high reliability and stable detection accuracy can be provided. Also, since the structure having the outer case 1 of aluminum in which the inner case 20 also made of aluminum is fitted in a nested state is employed, a small-sized (compact) and sturdy (firm) package configuration is provided. Therefore, a sensor unit 100 which allows a broad range of installation place options and has excellent durability can be provided.

Moreover, as the joining member 10, a silicone rubber packing with excellent airtightness is used. Therefore, the joining member 10 not only bonds the first joining surface 6 of the outer case 1 and the second joining surface 22 of the inner case 20 but also secures airtightness on the ring-shaped joining surface. Also, since an adhesive is applied to the perimeter of the connector 16 without any gap, airtightness is secured also in the opening part 21 of the inner case 20. With these configurations, airtightness (waterproofness) from the outside is secured inside the sensor unit 100. Thus, the internal environment of the sensor unit 100 is less susceptible to the influence of the external environment and can constantly perform measurement of inertial forces in a substantially constant stable environment. In other words, environment conditions to be used are broadened.

Thus, a sensor unit 100 which can be used under a broad range of environmental conditions and has high reliability can be provided. Also, airtightness can be similarly secured even in the case where other materials are used for the above joining member 10.

Also, since the substrate 15 is bonded to the inner case with an adhesive which is elastic (flexible) in the solidified state, this adhesive, too, functions as a vibration-proof member and buffer member which restrains noise vibrations from the inner case 20 to the substrate 15.

Therefore, since the adhesive on the substrate, in addition to the joining member 10, functions as a vibration-proof member and buffer member, noise vibrations can be reduced more effectively.

Thus, a sensor unit 100 with higher reliability and stable detection accuracy can be provided.

Figure 8:
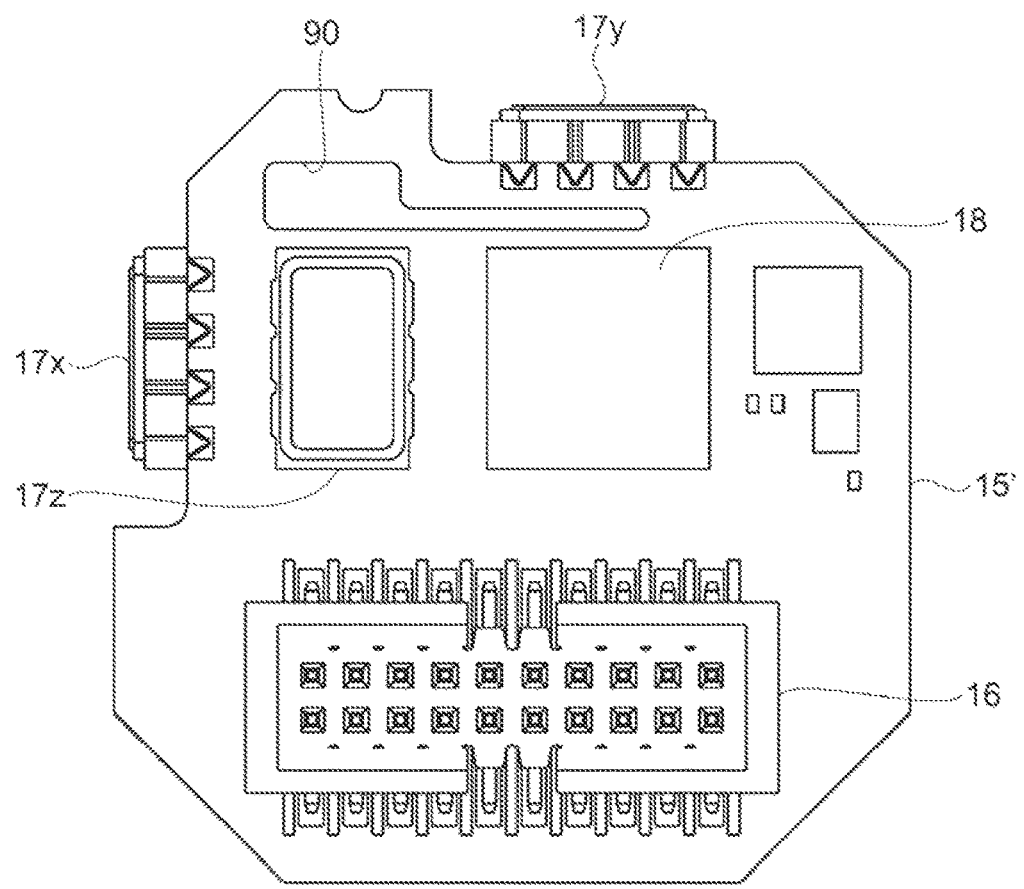
FIG. 8 is a plan view showing a substrate installed in a sensor unit according to Embodiment 2.
Figure 9:
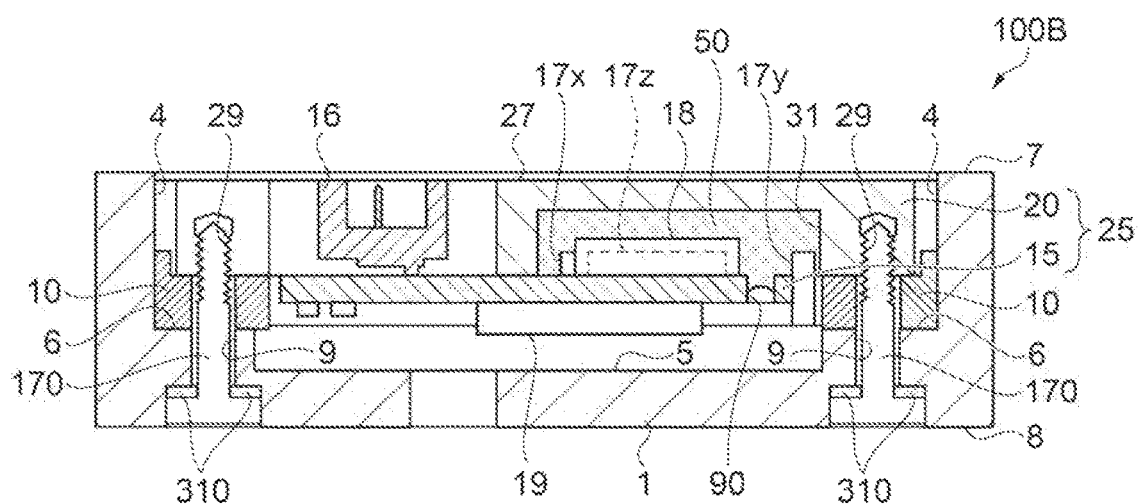
FIG. 9 is a cross-sectional view showing a vibration transmission restraining structure in the sensor unit according to Embodiment 2.

Embodiment 2 FIG. 8 is a plan view showing a substrate installed on a sensor unit according to Embodiment 2. Also, FIG. 9 is a cross-sectional view showing a vibration transmission restraining structure in the sensor unit according to Embodiment 2.

Hereinafter, the configuration of the sensor unit according to Embodiment 2 will be described with reference to these drawings. For the same component sites as in Embodiment 1, the same numbers are used and duplication explanation is omitted.

In FIG. 8, a substrate 15' installed in a sensor unit 100B according to Embodiment 2 (see FIG. 9) has roughly the same configuration as the substrate 15 in the sensor unit 100 in the above Embodiment 1 (see FIG. 4 or the like). A through-hole part 90 is formed in an area overlapping with the recessed part 31 as viewed in a plan view seen from the direction of thickness of the substrate 15' according to Embodiment 2. In this embodiment, the through-hole part 90 is formed near the area where various inertial sensors (17x, 17y, 17z, 18) are mounted, but without being limited to this. The through-hole part 90 may be provided in any part of the base member of the substrate 15'. It is preferable that the through-hole part 90 is formed near a site of the outer perimeter of the substrate 15' where trouble occurs if the filling member 50 overflows when the filling member 50 is provided to fill the space formed by the substrate 15' and the recessed part 31 of the inner case 20.

Also, the shape and number of through-hole parts 90 are not limited to the shape and number of through-hole parts 90 in FIG. 8. The shape and number of through-hole parts can be suitably formed. Preferably, the through-hole part 90 may be arranged more toward the center of the substrate 15' than at least one inertial sensor, as viewed in a plan view of the substrate 15'. More preferably, the through-hole part 90 may be situated on the other side of the inertial sensors from a communication path which communicates the side of the inner case 20 and the side of the outer case 1, in the space formed by the recessed part 31 and the substrate 15'. Thus, when the substrate 15' with the inertial sensors and the like mounted thereon is installed after the filling member 50 is put in the recessed part 31, the filling member 50 moves also toward the through-hole part 90 as well as to the communication path, which is a release part of the space. Therefore, the filling member 50 can be evenly spread throughout the space formed by the substrate 15' and the recessed part 31, and the inertial sensors can be evenly covered with the filling member 50.

As shown in FIG. 9, in the sensor module 25 having the substrate 15' installed in the inner case 20, an excess part beyond the capacity of the space, of the filling member 50 filling the space formed by the substrate 15' and the recessed part 31, is accommodated in the through-hole part 90. With this configuration, in the process of assembling the sensor module 25, the effects that process management is easier and that inconveniences such as an overflow of the filling member 50 to an unwanted site are prevented, can be achieved. Details will be described below, using FIG. 6.

In FIG. 6, when manufacturing the sensor unit 100B, first, the processes of installing (bonding) the substrate 15 in the inner case 20 to assemble the sensor module 25, then accommodating the sensor module 25 in the outer case 1 via the joining member 10, and screwing and fixing the sensor module 25 with the screws 170, are carried out.

To describe details of the process of assembling the sensor module 25 in the process of assembling this sensor unit, first, an adhesive for bonding the above substrate 15 and the inner case 20 is applied to a predetermined position on the inner case 20 or the substrate 15, and a predetermined amount of the filling member 50 is provided to fill the recessed part 31 of the inner case 20. Then, the inner case 20 and the substrate 15 are positioned and placed on top of each other. Subsequently, the adhesive for bonding the substrate 15 and the inner case 20, and the filling member 50 filling the space of the recessed part 31 are hardened.

Here, it is desirable that the "predetermined amount" of the filling member 50 filling the recessed part 31 of the inner case 20 is an amount such that, when the substrate 15' is installed in (bonded to) the inner case 20, the filling member 50 fills the space in such a way as to spread throughout the gaps between the respective inertial sensors (17x, 17y, 17z, 18) and other electronic components or the like arranged in the space formed by the substrate 15' and the recessed part 31, and such that there is no excess filling member 50 overflowing outward from the space. In other words, it can be said that the capacity of the space formed by the substrate 15' and the recessed part 31, minus the total volume of the respective inertial sensors (17x, 17y, 17z, 18) and other electronic elements or the like arranged in the space, is the "predetermined amount".

For example, in the case of providing the filling member 50 via a dispenser which is normally used in the process of providing an adhesive while controlling the amount of the adhesive provided, there is a risk that the amount of the filling member 50 provided changes and the amount of the filling member 50 provided cannot be accurately controlled, due to changes in ambient temperature, changes in the viscosity of the filling member 50 with time, and the like, causing insufficient filling with the filling member 50 or an overflow of the filling member 50 to an unwanted site from the space of the recessed part 31. In this embodiment, since the through-hole part 90 is formed in the area overlapping with the recessed part 31 as viewed in a plan view in the direction of thickness of the substrate 15', when the space formed by the substrate 15' and the recessed part 31 is filled with the filling member 50, an excess part of the filling member 50 beyond the capacity of the space of the recessed part 31 is accommodated in the through-hole part 90. That is, by predicting changes in the amount of the filling member 50 to be ejected from the above dispenser, and setting the amount of the filling member 50 to be ejected to a slightly large amount within the range of the capacity inside the through-hole part 90 within the thickness of the base member of the substrate 15', the inconvenience of insufficient filling with the filling member 50 or an overflow of the filling member 50 to an unwanted site can be prevented.

As described above, according to the sensor unit 100B with the substrate 15' installed therein according to this embodiment, a sensor unit 100B in which the amount of the filling member 50 provided in the process of assembling the sensor unit 100B can be controlled more easily and in which the restraining effect by the filling member 50 on the influence of noise vibrations is achieved more significantly, in addition to the effects of Embodiment 1, can be provided.

Also, since the filling state of the filling member 50 can be visually recognized through the through-hole part 90, the effect that the control of the amount of the filling member 50 to be ejected and quality inspections on the filing state of the filling member 50 can be carried out more easily, is achieved.

In this embodiment, the configuration in which the through-hole part 90 is provided in the substrate 15' is described. However, without being limited to this, a configuration in which a groove part opening to the surface on the side opposite the recessed part 31 is provided in the area overlapping with the recessed part 31 as viewed in a plan view seen from the direction of thickness of the substrate may be employed. According to this configuration, an excess part of the filling member 50 that cannot be accommodated in the space of the recessed part 31 is accommodated in the groove part and therefore roughly similar effects to the through-hole part 90 can be achieved.

The invention is not limited to the above embodiments, and various changes, improvements and the like can be added to the above embodiments. Modifications will be described below.

Modification 1

Figure 10:
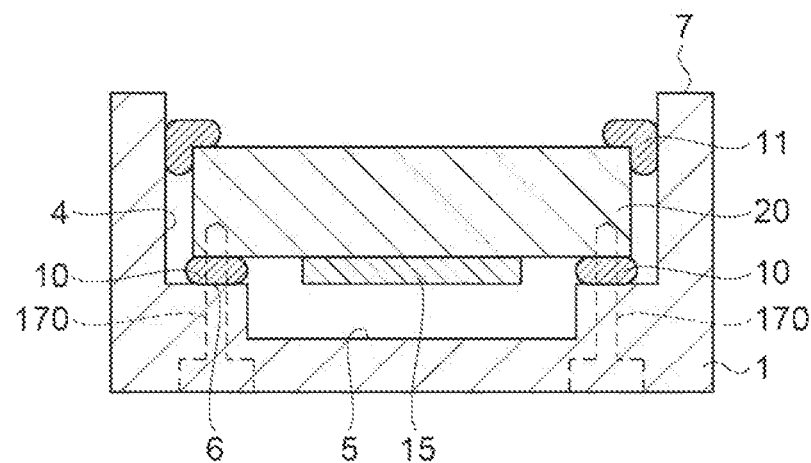
FIG. 10 is a cross-sectional view of a configuration according to Modification 1.
Figure 11:
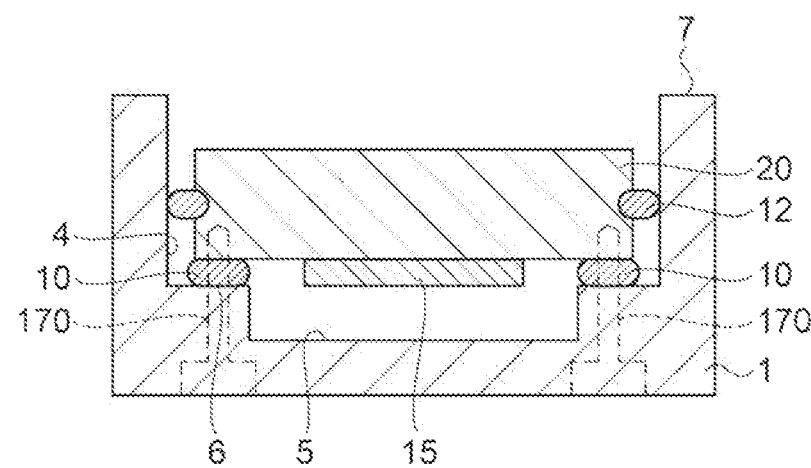
FIG. 11 is a cross-sectional view of a configuration according to Modification 1.

FIG. 10 and FIG. 11 are cross-sectional views, each showing a configuration of a sensor unit according to Modification 1.

In the embodiments, the joining member 10 is described as being one. However, without being limited to this configuration, a plurality of joining members may be used. Hereinafter, a sensor unit according to Modification 1 will be described. The same component sites as in the embodiments are denoted by the same numbers and duplicate explanation is omitted.

In the sensor unit in Modification 1, a joining member 11 may be further arranged at a peripheral edge part in a top part (top surface) of the inner case 20, in addition to the joining member 10, for example, as shown in FIG. 10. In this case, the joining member 10 may be a porous member, and the joining member 11 may be made of a silicone rubber with an L-shaped (crank-shaped) cross section. According to this configuration, necessary vibration-proofness and airtightness can be secured by complementarily using the two members utilizing their material properties, such as securing vibration-proofness with the joining member 10 and securing airtightness with the joining member 11. Moreover, by bonding at the two positions of the joining members 10, 11, the inner case 20 (sensor module) can be bonded to the outer case 1 more securely.

Also, without being limited to the configuration in which the joining member 11 with an L-shaped cross section is arranged in the top part of the inner case 20, a joining member may be arranged in other parts. For example, as shown in FIG. 11, a groove may be formed around the lateral surface of the inner case 20, and a joining member 12 may be arranged in the groove. With configuration, too, necessary vibration-proofness and airtightness can be secured similarly. Moreover, the cross section of the joining member 12 may be a simple circle, and the joining member 12 is invisible from outside and therefore raises no concerns about spoiling the aesthetic appearance. Also, the joining member 10 is described as being arranged on the first joining surface 6, which is a peripheral edge part one step higher than the center part in the bottom wall 5. However, without being limited to this, it suffices that the joining member 10 is configured to be arranged in a part where the outer case 1 and the inner case 20 face each other. For example, as a simple configuration with the side wall 4 and the bottom wall 5 without forming the first joining surface 6 in the bottom wall 5, the joining member 10 may be directly arranged at the peripheral edge part of the bottom wall 5.

Figure 12:
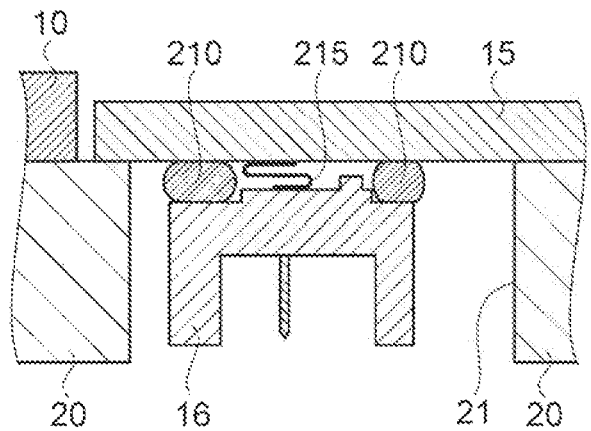
FIG. 12 is a cross-sectional view of a configuration according to Modification 2.
Figure 13:
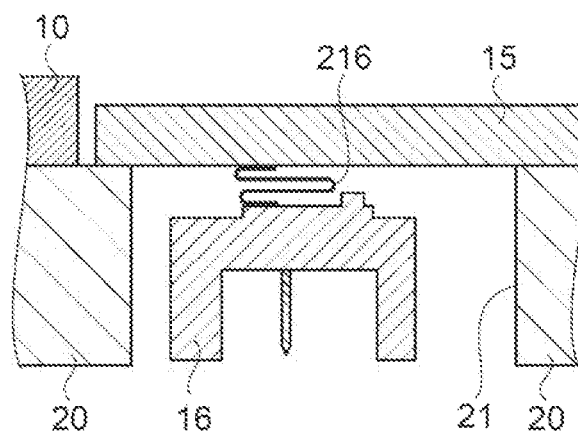
FIG. 13 is a cross-sectional view of a configuration according to Modification 2.

Modification 2 FIG. 12 and FIG. 13 are partly enlarged cross-sectional views of one configuration according to Modification 2. Specifically, the part where the connector 16 is mounted on the substrate 15 in the sensor unit 100 of FIG. 7 is turned upside down and shown in an enlarged manner.

In the sensor unit 100 of the embodiment, the connector 16 for connection to the outside is mounted on the substrate 15, and the opening part 21 for exposing the connector 16 to the outside is formed in the inner case 20. In this configuration, a socket-type (female) connector is connected to the connector 16 from an installation target device as an external device. However, if an external connection terminal of the connector 16 is mounted on the substrate 15 by soldering or the like, there is a risk that noise vibrations generated by the installation target device may be propagated to the sensor module via the connector 16. As a configuration to avoid such inconveniences, the connector 16 is positioned and fixed to the substrate 15 via an elastic member 210, and the electrical connection between the connector 16 and the substrate 15 is carried out using a flexible wiring member 215 such as a flexible substrate or sheathed cable, for example, as shown in FIG. 12.

Also, as shown in FIG. 13, a configuration in which the substrate 15 and the connector 16 are connected together by a flexible wiring member 216, without mechanically connecting the connector 16 to the substrate 15, may be employed. By employing the joining and connection structures between the substrate 15 and the connector 16 based on the above methods, the risk of transmission of noise vibrations from the connector 16 is reduced. Therefore, a sensor unit 100 which has stability of detection accuracy and high reliability and which can perform secure communication operations with the installation target device can be provided.

Figure 14:
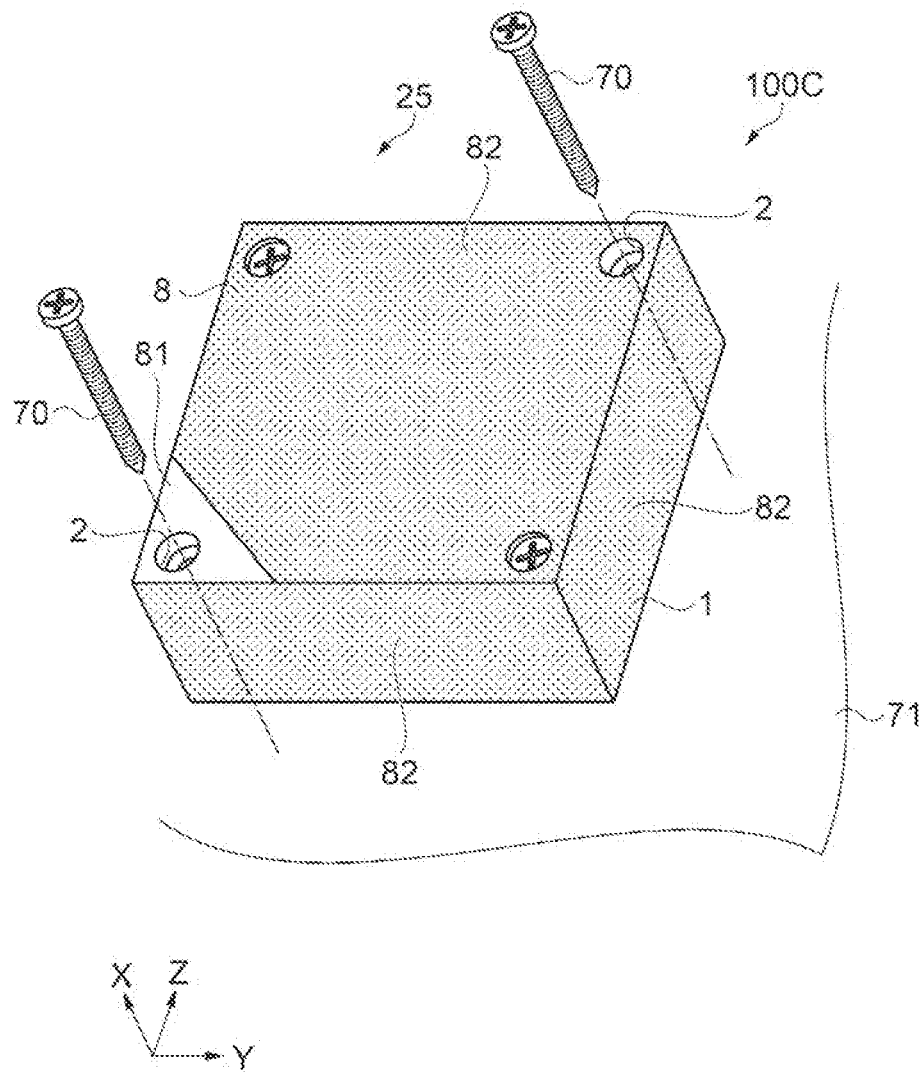
FIG. 14 is a perspective view of a sensor unit according to Modification 3.

Modification 3 FIG. 14 is a perspective view of a sensor unit according to Modification 3. The same component sites as in the above embodiments are denoted by the same numbers and duplication explanation is omitted.

A sensor unit 100C shown in FIG. 14 is sliced out of a metal such as aluminum, zinc or stainless steel, and a coated surface 82 is formed thereon by coating a major part of the outer surface of the outer case 1 with an insulative paint. The coated surface 82 is provided for the purpose of decorating the external appearance of the sensor unit 100C, surface protection to restrain oxidation and scratches or the like on the surface of the outer case 1, or insulation or the like.

Also, an exposed part 81 which is an opening part of the coated surface 82 and where the underlying metal surface is exposed is formed from the edge to the peripheral part of the screw holes 2 formed near two vertices situated in a diagonal direction, in the square plane of the outer case 1, which is a rectangular parallelepiped with a substantially square planar shape. The exposed part 81 in this embodiment is formed only around the screw hole 2 in one corner part of the four corner parts of the substantially square plane. The two metal screws 70 are inserted in the two screw holes 2 at the corner part where this exposed part 81 is formed and at the corner part situated diagonally thereto on the plane, and the sensor unit 100C is thus fixed and used on the installation target surface 71 of an installation target body (device) such as an automobile.

According to the sensor unit 100C in this modification, the sensor unit 100C can be grounded on the ground of the installation target body by fixing the sensor unit 100C to the installation target body via the metal screws 70. Therefore, a sensor unit 100C that can obtain more accurate detection results can be provided.

Also, in this modification, the configuration in which the exposed part 81 is provided only at the one corner part of the four corner parts of the substantially square plane of the outer case 1 is employed. This has the effect that the direction of installation of the sensor unit 100C to the installation target body can be confirmed with reference to the exposed part 81.

Meanwhile, if there is no need to use the exposed part 81 as a reference for the direction of installation of the sensor unit 100C, the exposed part 81 and an exposed part in the opposite corner part may be provided, that is, at two positions. The exposed part may also be provided at three positions or four positions, including the other corner parts.

Figure 15:
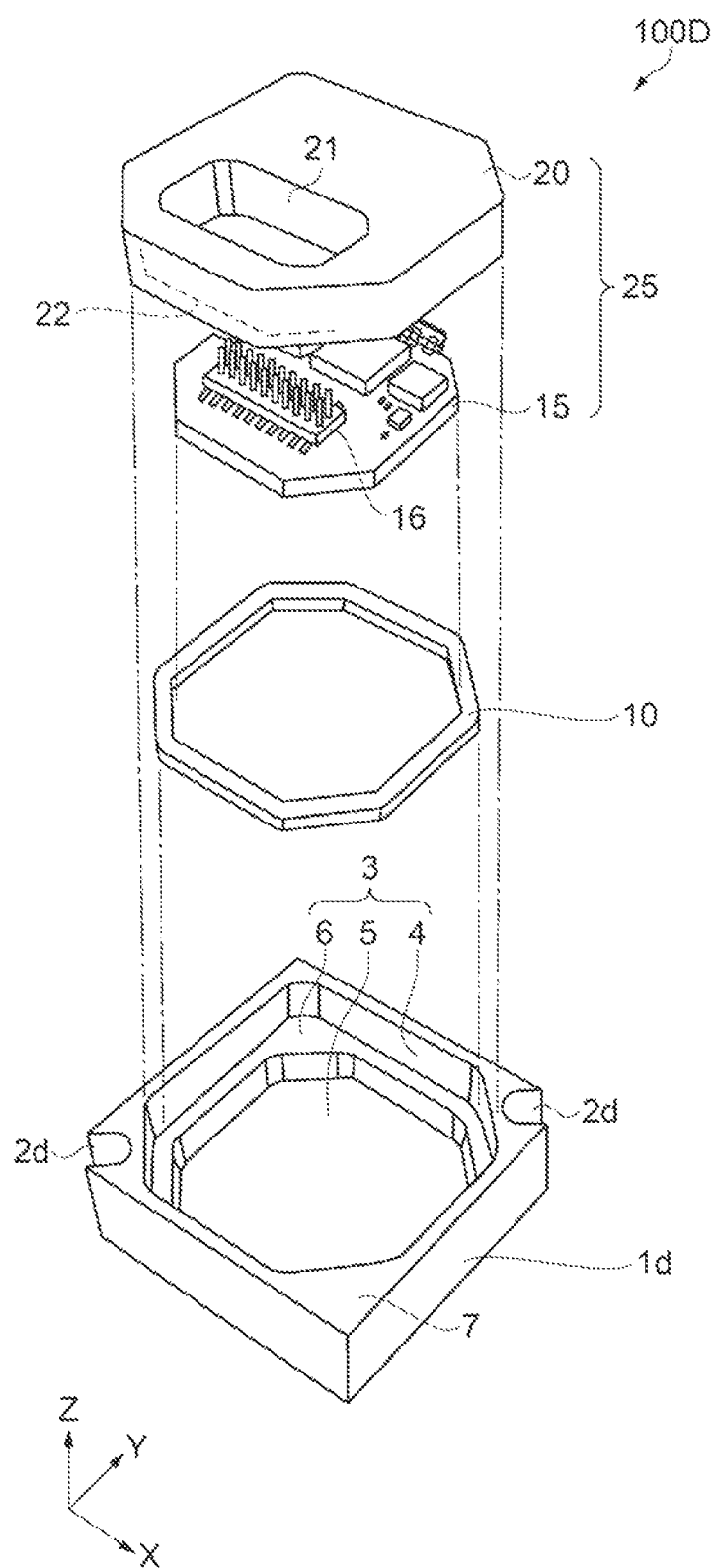
FIG. 15 is an exploded perspective view of a sensor unit according to Modification 4.

Modification 4 FIG. 15 is an exploded perspective view of a sensor unit according to Modification 4.

Hereinafter, the configuration of the sensor unit according to Modification 4 will be described in detail, mainly referring to FIG. 15 and also referring to other illustrations when appropriate. The same component parts as in the foregoing embodiments and modifications are denoted by the same numbers and duplication explanation is omitted.

As shown in FIG. 15, a sensor unit 100D is made up of an outer case 1d, a joining member 10, and a sensor module 25 or the like. In other words, the sensor unit 100D has a configuration in which the sensor module 25 is fitted (inserted) in an inside 3 of the outer case 1d via the joining member 10. The sensor module 25 is made up of an inner case 20 and a substrate 15. While the outer case and the inner case are used as the names of parts in order to facilitate the understanding of the description, these parts may be referred to instead as a first case and a second case.

The outer case 1d is a pedestal sliced out of aluminum into a box-shape. The material is not limited to aluminum, and other metals such as stainless steel, a resin, or a composite material of metal and resin, or the like, maybe used. The outer shape of the outer case 1d is a rectangular parallelepiped with a substantially square planar shape, and cut-out holes 2d as fixing parts are formed near two vertices situated in a diagonal direction of the square, similarly to the above-described overall shape of the sensor unit 100. However, these parts are not limited to the cut-out holes 2d, and a flange (brim) may be formed on the lateral side of the outer case 1d to provide a configuration to screw the flange part.

The outer case 1d is in the shape of a box having a rectangular parallelepiped outer shape and having no cover, and its inside 3 (inner side) is an internal space (container) surrounded by a bottom wall 5 and a side wall 4. The planar shape of the inside 3 is a heptagon formed by chamfering the corners at three vertex parts of a square, and two of the three chamfered vertex parts correspond to the positions of the cut-out holes 2d. Also, in the cross-sectional shape of the inside 3 (direction of thickness), a first joining surface 6 that is one step higher than the bottom wall 5 is formed between the bottom wall 5 and the side wall 4. The first joining surface 6 is a part of the side wall 4 and is a one-step stair-like site formed in a ring shape surrounding the bottom wall 5 along the plane.

The inner case 20 is a member which supports the substrate 15, and has a shape that can be accommodated in the inside 3 of the outer case 1d. More specifically, as viewed in a plan view, the inner case 20 is in the shape of a heptagon formed by chamfering the corners at three vertex parts of a square, and inside this, an opening part 21 as a rectangular through-hole is formed. Two of the three chamfered vertex parts correspond to the positions of the cut-out holes 2d of the outer case 1d. In the direction of thickness (Z-axis direction), the inner case 20 is lower than the height from the top surface 7 of the outer case 1d to the first joining surface 6. In a preferred example, the inner case 20, too, is sliced out of aluminum. However, other materials may also be used, as with the outer case 1d.

On the back side of the inner case 20 (surface on the side of the outer case 1d), a guide pin for positioning the substrate 15 and a support surface (neither of them illustrated) are formed. The substrate 15 is set (positioned and installed) by the guide pin and the support surface, and is bonded to the back side of the inner case 20. Details of the substrate 15 will be described later. A peripheral edge part on the back side of the inner case 20 is a second joining surface 22 made up of a ring-shaped plane. The second joining surface 22 has a shape substantially similar to the first joining surface 6 of the outer case 1d as viewed in a plan view. When the inner case 20 is set in the outer case 1d, the two surfaces face each other in the state of sandwiching the joining member 10. Also, the structure of the outer case 1d and the inner case 20 is an example, and the outer case 1d and the inner case 20 are not limited to this structure.

Figure 16:
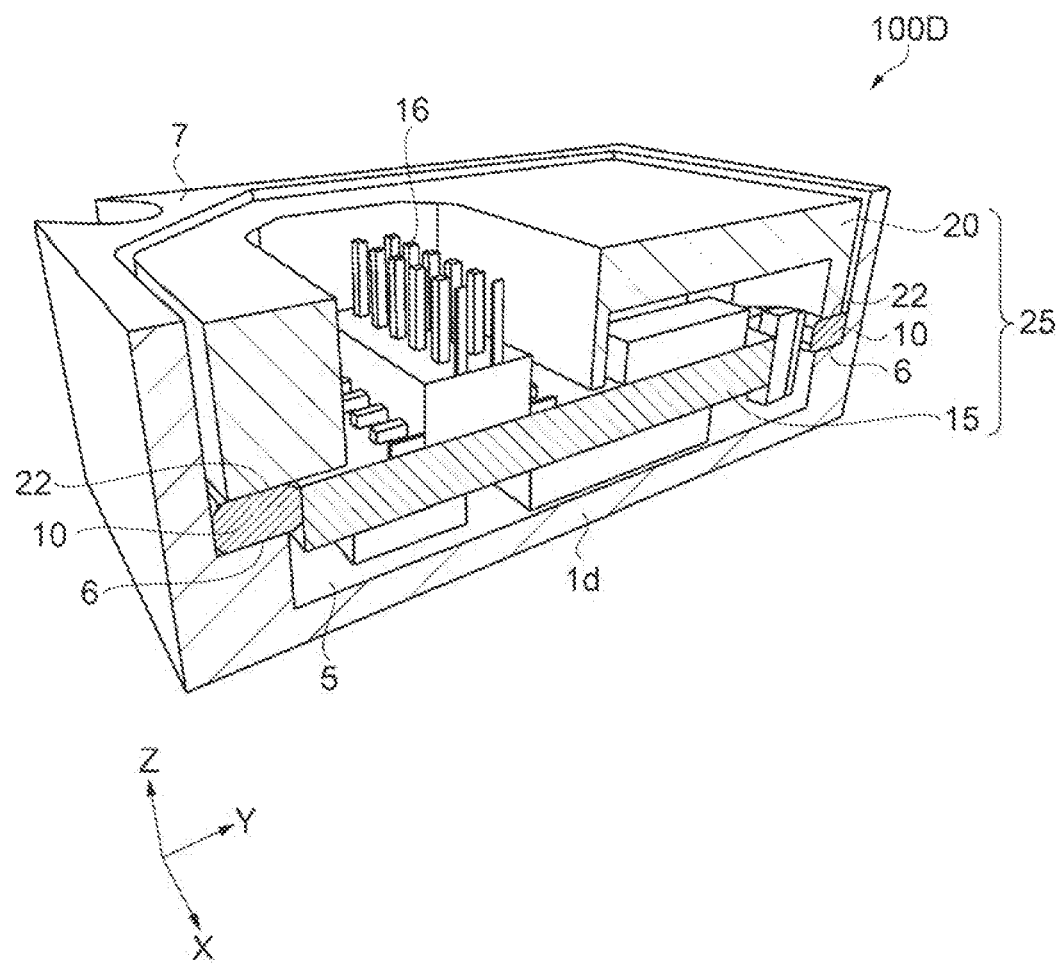
FIG. 16 is a cross-sectional perspective view of the sensor unit according to Modification 4.

FIG. 16 is a cross-sectional perspective view of the sensor unit according to this modification.

Next, essential parts of the advantageous package configuration of the sensor unit 100D will be described in detail, also referring to FIG. 15 when appropriate.

First, the substrate 15 is bonded to the inner case 20 with an adhesive (not illustrated) which is elastic (flexible) even after hardening. As a preferred example, a silicone rubber-based adhesive is used. However, without being limited to the silicone rubber-based adhesive, any adhesive that is more flexible than the outer case 1d after hardening may be used, and a normal temperature hardening type, two-part type, thermosetting type, ultraviolet setting type, or composite type of these may be used. For example, these components may be bonded and fixed together using a rubber-based adhesive or hot melt adhesive (glue). Also, since an adhesive is applied without any gap around the connector 16, airtightness (sealing capability) from the outside air (outside) is secured, thus preventing the entry of the outside air into the back side of the substrate 15.

The joining member 10 is a packing (gasket) with a thickness of approximately 1 mm, having a ring-like planar shape along the first joining surface 6 of the outer case 1*d*, as shown in FIG. 15. As a preferred example, a packing with an elliptical cross-sectional shape, formed by a compression molding method using a dedicated metal mold, is employed. Also, the cross-sectional shape may be circular or rectangular. As a preferred example, a self-adhesive packing of silicone rubber is used. This packing is impregnated with a silicone rubber-based adhesive and therefore plays the role of bonding (joining) the first joining surface 6 of the outer case 1*d* and the second joining surface 22 of the inner case 20. Also, the joining member 10 is not limited to this configuration and may be of any material that is more flexible (elastic) than the outer case 1*d*. For example, a rubber or elastomer maybe used, and a porous member such as a sponge may be used. Also, a packing may be formed of these materials and an adhesive may be applied at the time of assembly, thus providing adhesiveness.

Alternatively, the foregoing adhesive for the substrate 15 may be used. For example, after a thermosetting adhesive is applied to the second joining surface 22 of the inner case 20 by an ink jet method or the like, primary (preliminary) hardening may be carried out to form the joining member 10 in a semi-hardened state, and after the joining member 10 is incorporated in the outer case 1*d*, secondary (main) hardening may be carried out. In a preferred example, the outer case 1*d* and the inner case 20 both use aluminum with good thermal conductivity, and therefore the joining member 10 can be hardened efficiently even after assembly.

FIG. 16 is referred to again.

As the sensor module 25 (inner case 20) is incorporated into the outer case 1*d*, the state where the joining member 10 is sandwiched between the first joining surface 6 of the outer case 1*d* and the second joining surface 22 of the inner case 20 is provided. More specifically, the state where the joining member 10 is compressed and slightly crushed by the two surfaces is provided. In other words, the configuration in which the first joining surface 6, the joining member 10 and the second joining surface 22 are placed on top of one another is provided.

Here, between the outer shape of the inner case 20 and the outer case 1*d*, a predetermined gap is formed over its entire perimeter, as shown in FIG. 16. In other words, the inner case 20 and the outer case 1*d* are joined together via the joining member 10 only. Also, the height of the top surface of the sensor module 25 (inner case 20) is lower than the top surface 7 of the outer case 1*d*. In other words, the inner case 20 is fitted in the outer case 1*d*, like a drop lid in a pot. The settings of the gap and the thickness of the inner case 20 are deliberately defined in the design stage.

As described above, the sensor unit 100D according to this modification can achieve the following effects.

The sensor module 25 (inner case 20) is joined to the inner wall surface of the outer case 1*d* via the joining member 10. Since the inner case 20 is set to a size such that a predetermined gap is formed over its entire perimeter when incorporated in the outer case 1*d*, the two cases are configured to be joined together via the joining member 10 only.

Here, the joining member 10 is formed of a material which is more flexible (elastic) than the outer case 1*d* and therefore plays the role of absorbing (attenuating) noise vibrations transmitted from the outer case 1*d*. In other words, the joining member 10, as a vibration-proof member with a vibration-proof property, restrains noise vibrations from reaching the inner case 20. Alternatively, it may be paraphrased as a buffer member for reducing noise vibrations. Particularly, an inertial sensor using the MEMS technique is a micro machine having a comb electrode structure or the like, and therefore reacts significantly to vibrations of resonance frequencies particular to the structure, posing a risk that the result of measurement may include noises. However, according to these configurations, noise vibrations can be restrained securely.

Moreover, the configuration in which the outer case 1*d*, the joining member 10 and the inner case 20 formed with high precision by cutting or with metal molds are assembled by being placed on top of one another in this order is employed. Therefore, unlike the configuration in which the inertial sensor is in a suspended state as in the related-art technique, the substrate 15 (sensor module 25) with the inertial sensors installed thereon can be accurately positioned. In other words, the positions of the inertial sensors are constantly stable. Also, the configuration in which these are assembled by being placed on top of one another is easy to work on and achieves high manufacturing efficiency.

Thus, according to the sensor unit 100D, since the positions of the inertial sensors are stable, its reliability is high, and since the vibration-proof joining member 10 is provided, the sensor unit is less susceptible to the influence of noise vibrations, and detection accuracy becomes stable.

Thus, a sensor unit 100D with high reliability and stable detection accuracy can be provided. Also, since the structure having the outer case 1*d* of aluminum in which the inner case 20 also made of aluminum is fitted in a nested state is employed, a small-sized (compact) and sturdy (firm) package configuration is provided. Therefore, a sensor unit 100D which allows a broad range of installation place options and has excellent durability can be provided.

Moreover, as the joining member 10, a silicone rubber packing with excellent airtightness is used. Therefore, the joining member 10 not only bonds the first joining surface 6 of the outer case 1*d* and the second joining surface 22 of the inner case 20 but also secures airtightness on the ring-shaped joining surface. Also, since an adhesive is applied to the perimeter of the connector 16 without any gap, airtightness is secured also in the opening part 21 of the inner case 20. With these configurations, airtightness (waterproofness) from the outside is secured inside the sensor unit 100D. Thus, the internal environment of the sensor unit 100D is less susceptible to the influence of the external environment and can constantly perform measurement of inertial forces in a substantially constant stable environment. In other words, environment conditions to be used are broadened.

Thus, a sensor unit 100D which can be used under a broad range of environmental conditions and has high reliability can be provided. Also, airtightness can be similarly secured even in the case where other materials are used for the above joining member 10.

Also, since the substrate 15 is bonded to the inner case 20 with an adhesive which is flexible even after hardening, this adhesive, too, functions as a vibration-proof member and buffer member which restrains noise vibrations from the inner case 20 to the substrate 15.

Therefore, since the adhesive on the substrate, in addition to the joining member 10, functions as a vibration-proof member and buffer member, noise vibrations can be reduced more effectively.

Thus, a sensor unit 100D with higher reliability and stable detection accuracy can be provided.

Also, the connector 16 for connection to the outside is mounted on the substrate 15, and the opening part 21 for exposing the connector 16 to the outside is formed in the inner case 20. Although a socket-type (female) connector is connected to the connector 16 from an installation target device, a flexible wiring member such as a flexible substrate or sheathed cable is used for its wiring part and therefore the risk of transmission of noise vibrations from the connector 16 is low. Thus, a sensor unit 100D which has stability of detection accuracy and high reliability and which can perform secure communication operations with the installation target device can be provided.

Also, the height of the top surface of the sensor module 25 (inner case 20) is lower than the top surface 7 of the outer case 1*d* and housed in the shape of a drop lid in a pot. Therefore, even in the case of fixing the side of the inner case 20 toward the installation target device, for example, the inner case 20 does not come in contact with the installation target surface and therefore, the propagation of noise vibrations can be prevented. Thus, a convenient sensor unit 100D that can be used even if its top and bottom (up and down sides) are inverted, can be provided.

Figure 17:
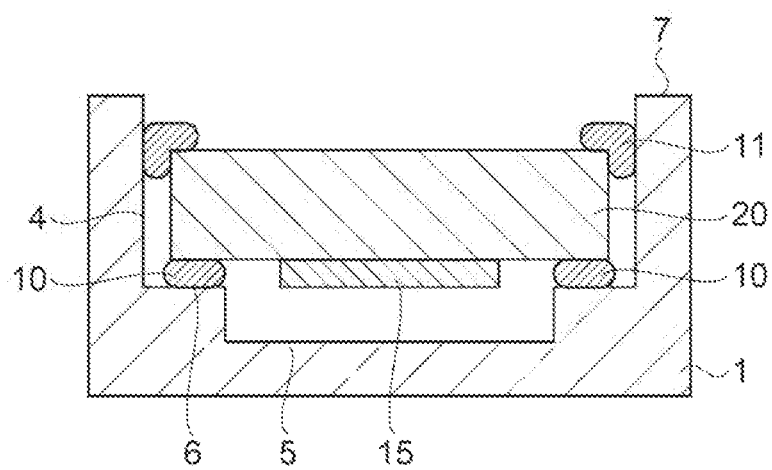
FIG. 17 is a cross-sectional view showing an example of a sensor unit according to Modification 5.
Figure 18:
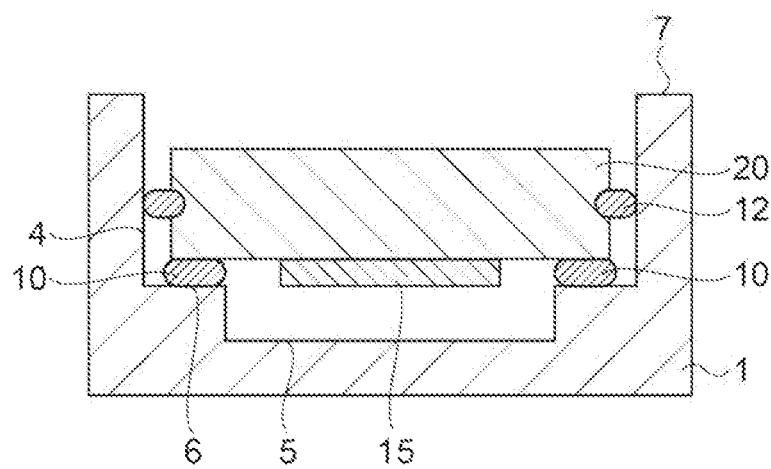
FIG. 18 is a cross-sectional view showing an example of the sensor unit according to Modification 5.

Modification 5 FIG. 17 and FIG. 18 are cross-sectional views showing an example of a sensor unit according to Modification 5.

In the above Modification 4, the joining member 10 is described as being one. However, without being limited to this configuration, a plurality of joining members may be used. For example, as shown in FIG. 17, a joining member 11 may be further arranged at a peripheral edge part in a top part (top surface) of the inner case 20, in addition to the joining member 10. In this case, the joining member 10 may be a porous member, and the joining member 11 may be made of a silicone rubber with an L-shaped (crank-shaped) cross section. According to this configuration, necessary vibration-proofness and airtightness can be secured by complementarily using the two members utilizing their material properties, such as securing vibration-proofness with the joining member 10 and securing airtightness with the joining member 11. Moreover, by bonding at the two positions of the joining members 10, 11, the inner case 20 (sensor module) can be bonded to the outer case 1 more securely.

Also, without being limited to the configuration in which the joining member 11 with an L-shaped cross section is arranged in the top part of the inner case 20, a joining member may be arranged in other parts. For example, as shown in FIG. 18, a groove may be formed around the lateral surface of the inner case 20, and a joining member 12 may be arranged in the groove. With configuration, too, necessary vibration-proofness and airtightness can be secured similarly. Moreover, the cross section of the joining member 12 may be a simple circle, and the joining member 12 is invisible from outside and therefore raises no concerns about spoiling the aesthetic appearance. Also, the joining member 10 is described as being arranged on the first joining surface 6, which is one step higher than the bottom wall 5. However, without being limited to this, it suffices that the joining member 10 is configured to be arranged in a part where the outer case 1 and the inner case 20 face each other. For example, as a simple configuration with the side wall 4 and the bottom wall 5 without forming the first joining surface 6, the joining member 10 may be directly arranged at the peripheral edge part of the bottom wall 5.

Figure 19:
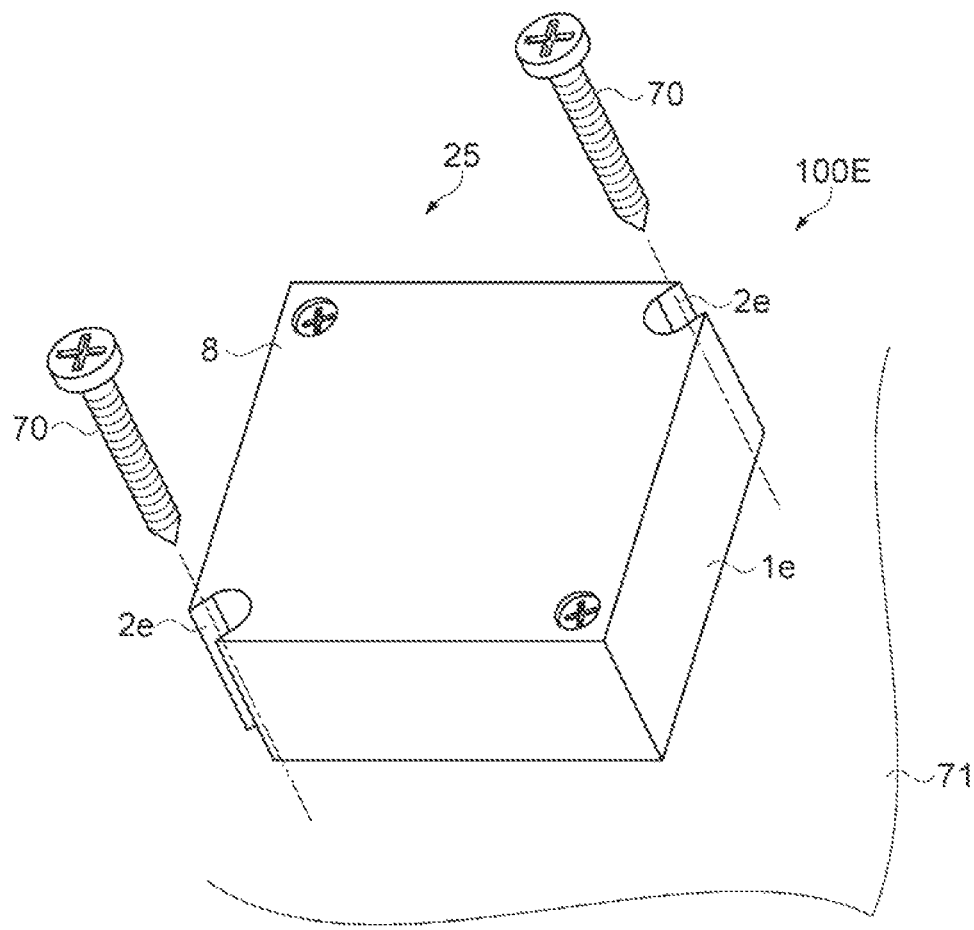
FIG. 19 is a perspective view showing the state where a sensor unit according to Modification 6 is fixed to an installation target surface.
Figure 20:
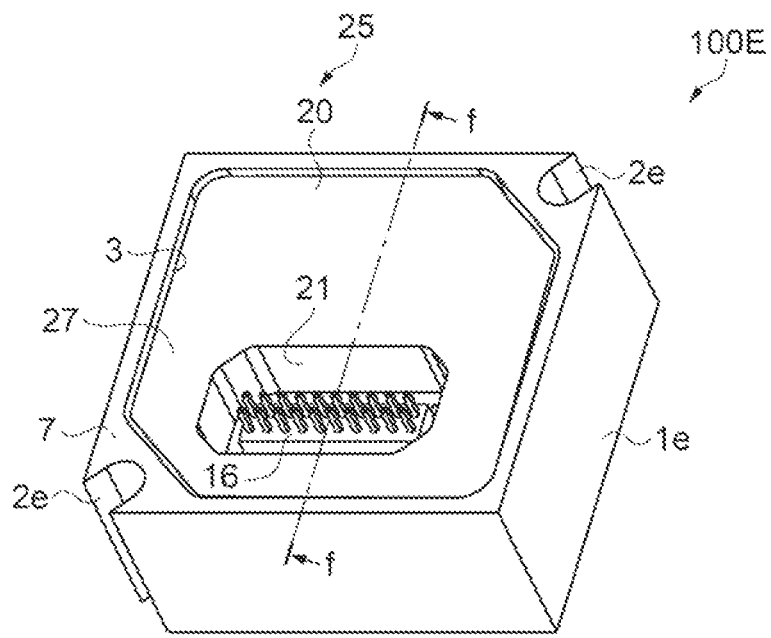
FIG. 20 is a perspective view showing an outline of the sensor unit according to Modification 6, as viewed from the installation target surface side in FIG. 19.
Figure 20:

Modification 6 FIG. 19 is a perspective view showing the state where a sensor unit according to Modification 6 is fixed to an installation target surface. Also, FIG. 20 is a perspective view showing an outline of the sensor unit, as viewed from the installation target surface side in FIG. 19. First, an outline of a sensor unit 100E according to this modification will be described. The same component sites as in the embodiments are denoted by the same numbers and duplicate explanation is omitted.

In FIG. 19, the sensor unit 100E is an inertial measurement unit (IMU) which detects the attitude or behavior (amount of inertial motion) of a moving body (installation target device) such as an automobile or robot. The sensor unit 100E functions as a so-called six-axis motion sensor having a three-axis acceleration sensor and a three-axis angular velocity sensor.

The sensor unit 100E is a rectangular parallelepiped having a substantially square planar shape, with its size being about 3 cm long on each side of the square and about 1 cm thick. Cut-out holes 2*e* as fixing parts are formed near two vertices situated in a diagonal direction of the square. The sensor unit 100E is used in the state of being fixed to an installation target surface 71 of an installation target body (device) such as an automobile by having two screws 70 passed through these two cut-out holes 2*e*. Also, the above size is an example, and it is possible to miniaturize the sensor unit 100E to a size installable in a smartphone or digital camera, for example, by selecting components and changing design.

The sensor unit 100E employs a package configuration that is advantageous for restraining noise vibrations such as engine vibrations of an automobile transmitted from the installation target surface 71. With this configuration, higher reliability and stability of detection accuracy than the traditional sensor units are realized. Hereinafter, this advantageous package configuration will be described in detail. However, this configuration is not limited to an IMU having a six-axis motion sensor and can be applied to any unit or device having an inertial sensor.

As shown in FIG. 20, an opening part 21 is formed on the surface of the sensor unit 100E. A plug-type (male) connector 16 is arranged inside (on the inner side of) the opening part 21. The connector 16 has a plurality of pins and the plurality of pins is arranged, extending in a lateral direction, as viewed from the front of FIG. 20. In the description below, the extending direction of the plurality of pins is defined as an X-axis direction. In other words, in the square shape of the sensor unit 100E, the extending direction of the sides that lie in the lateral direction as viewed from the front of FIG. 20 is defined as the X-axis direction. Also, the extending direction of the sides in the direction orthogonal to the X-axis direction in the square shape is defined as a Y-axis direction. Then, the direction of thickness of the sensor unit 100E is described as a Z-axis direction.

A socket-type (female) connector (not illustrated) is connected to the connector 16 from an installation target device, and the transmission/reception of electricity for the sensor unit 100 and electrical signals such as detection data is carried out between the two connectors.

The sensor unit 100E employs a package configuration that is advantageous for restraining noise vibrations such as engine vibrations of an automobile transmitted from the installation target surface 71 (see FIG. 19). With this configuration, higher reliability and stability of detection accuracy than the traditional sensor units are realized. Hereinafter, this advantageous package configuration will be described in detail. However, this configuration is not limited to an IMU having a six-axis motion sensor and can be applied to any unit or device having an inertial sensor.

Figure 21:
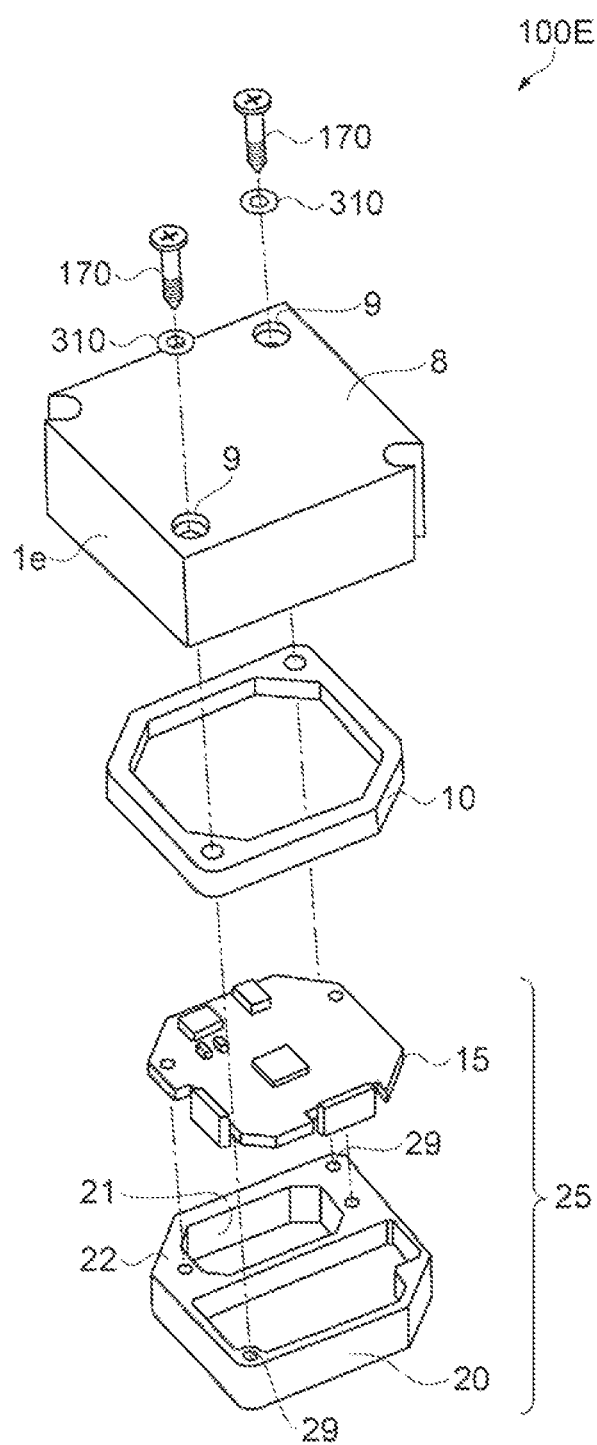
FIG. 21 is an exploded perspective view showing the sensor unit according to Modification 6, as viewed from the same direction as in FIG. 19.
Figure 22:
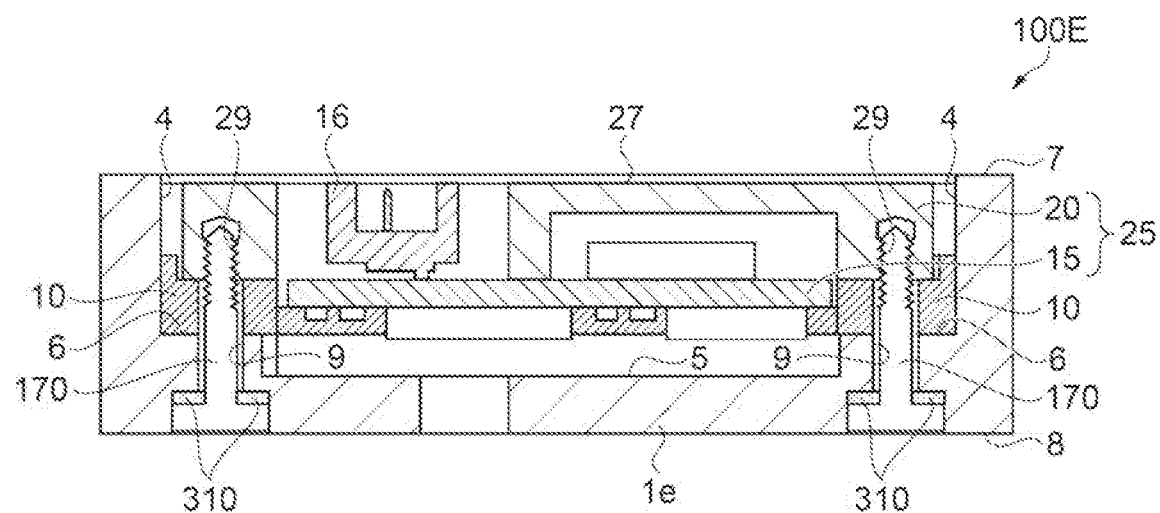
FIG. 22 is a cross-sectional view showing a vibration transmission restraining structure in the sensor unit according to Modification 6.

FIG. 21 is an exploded perspective view showing the sensor unit 100E in this modification, as viewed from the same direction as in FIG. 19. Also, FIG. 22 is a cross-sectional view showing a vibration (noise vibration) transmission restraining structure in the sensor unit 100E. Hereinafter, the noise vibration transmission restraining structure or the like provided in the sensor unit 100E in this modification will be described in detail, using these drawings.

As shown in FIG. 21, in the sensor unit 100E in which a sensor module 25 made up of an inner case 20 and a substrate 15, and an outer case 1e, are fitted together via a joining member, the sensor module 25 and the outer case 1e are fastened (fixed) by screws 170 as fastening members. In this modification, two screws 170 are used as fastening members. However, the number of screws 170 is not limited to this. Also, the two screws 170 are inserted in through-holes 9 provided in the outer case 1e from the side of a bottom surface 8, and are screwed and fixed to the inner case 20, sandwiching the joining member 10 and the substrate 15. The fastening structure of each part of the sensor unit 100E described above, and the noise vibration transmission restraining structure in the fastening structure will be described in detail below.

In FIG. 22, the through-holes 9 for the screws 170 are provided on the side of the bottom surface 8 of the outer case 1e. In this modification, two through-holes 9 are provided near opposite angles of the bottom surface 8 of the outer case 1e (see FIG. 21). Through-holes are provided at positions overlapping with the through-holes 9, in the joining member 10, as viewed in a plan view, and screw holes 29 are formed at positions overlapping with the through-holes 9, in the inner case 20, as viewed in a plan view. Then, as the screws 170 as fastening members inserted from the through-holes 9 of the outer case 1e are screwed in the screw holes 29 of the inner case 20, the sensor module 25 is fastened and fixed inside the outer case 1e via the joining member 10 (elastic member). Here, recessed parts accommodating the screw heads of the screws 170 are formed on the side of the bottom surface 8 at the parts where the through-holes 9 are formed, in the outer case 1e. In the recessed parts, the screws 170 are inserted in the through-holes 9 of the outer case 1e via elastic members 310. Also, the depth of the recessed parts is set in such a way that the screw heads of the screws 170 in the fastened state do not protrude outward from the bottom surface 8.

Also, in FIG. 22, the joining member 10 provided between the outer case 1e and the inner case 20 of the sensor module 25 is arranged in contact with the first joining surface 6 as a part of the bottom wall 5 of the outer case 1e and in contact with the side wall 4 rising from the first joining surface 6 (bottom wall 5). That is, the joining member 10 is formed with an L-shaped (crank-shaped) cross section.

Also, as shown in FIG. 22, in the state where the sensor module 25 is housed in the outer case 1e, the height of the top surface (that is, the bottom surface of the inner case 20) 27 of the sensor module 25 is lower than the height of the top surface 7 of the outer case 1e. Also, since the joining member 10 is made up of an elastic member in the configuration shown in FIG. 22, the height of the top surface 27 of the sensor module 25 with respect to the height of the top surface 7 of the outer case 1e can be adjusted by the fastening torque of the screws 170 in the process of assembling the sensor unit 100E.

As described above, the sensor unit 100E according to this modification can achieve the following effects.

The sensor module 25 (inner case 20) is joined to the first joining surface 6, which is a part of the bottom wall 5 of the outer case 1e, via the joining member 10. Since the inner case 20 is set to a size such that a predetermined gap is formed over its entire perimeter when incorporated in the outer case 1e, the two cases are configured to be joined together via the joining member 10 only.

Here, the joining member 10 is formed of a material with a lower elastic modulus (more flexible) than the outer case 1e and therefore serves to absorb (attenuate) noise vibrations transmitted from the outer case 1e. In other words, the joining member 10, as a vibration-proof member with a vibration-proof property, restrains noise vibrations from reaching the inner case 20. Alternatively, it may be paraphrased as a buffer member for reducing noise vibrations. Particularly, an inertial sensor using the MEMS technique is a micro machine having a comb electrode structure or the like, and therefore reacts significantly to vibrations of resonance frequencies particular to the structure, posing a risk that the result of measurement may include noises. However, according to these configurations, noise vibrations can be restrained securely.

Also, the height of the top surface 27 of the sensor module 25 (inner case 20) is lower than the top surface 7 of the outer case 1e and housed in the shape of a drop lid in a pot. Therefore, even in the case of fixing the side of the inner case 20 toward the installation target device, for example, the inner case 20 does not come in contact with the installation target surface. Therefore, the propagation of noise vibrations can be prevented. Thus, a convenient sensor unit 100E that can be used even if its top and bottom (up and down sides) are inverted, can be provided.

Also, according to the sensor unit 100E in the embodiment, the configuration in which the outer case 1e and the sensor module 25 are fastened together with the screws 170 inserted from the through-holes 9 provided in the outer case 1e, with the joining member 10 as an elastic member arranged between the outer case 1e and the sensor module 25, and with the elastic members 310 arranged between the screw heads of the screws 170 and the outer case 1e, is provided.

According to this configuration, since the joining member 10 and the elastic members 310, which are elastic, are arranged between the outer case 1e and the sensor module 25, the propagation of noise vibrations from the outer case 1e to the sensor module 25 can be restrained more securely in the fastening structure between the outer case 1e and the sensor module 25 with the screws 170.

Also, the joining member 10 is configured in such a way as to be in contact with the first joining surface 6, which is a part of the bottom wall 5 of the outer case 1e, and also in contact with the side wall 4 rising from the first joining surface 6. Thus, the propagation of noise vibrations due to the contact of the sensor module 25 with the side wall 4 of the outer case 1e can be restrained. Also, by using the joining member 10 as a positioning guide for the sensor module 25 to the outer case 1e in the assembling process, the effect that work performance in the assembly is improved can be expected.

Moreover, the configuration in which the outer case 1e, the joining member 10 and the inner case 20 formed with high precision by cutting or with metal molds are assembled by being placed on top of one another in this order is employed. Therefore, unlike the configuration in which the inertial sensor is in a suspended state as in the related-art technique, the substrate 15 (sensor module 25) with the inertial sensors installed thereon can be accurately positioned. In other words, the positions of the inertial sensors are constantly stable. Also, the configuration in which these are assembled by being placed on top of one another is easy to work on and achieves high manufacturing efficiency.

Thus, according to the sensor unit 100E, since the positions of the inertial sensors are stable, its reliability is high, and since the vibration-proof joining member 10 is provided, the sensor unit is less susceptible to the influence of noise vibrations, and detection accuracy becomes stable.

Thus, a sensor unit 100E with high reliability and stable detection accuracy can be provided. Also, since the structure having the outer case 1*e* of aluminum in which the inner case 20 also made of aluminum is fitted in a nested state is employed, a small-sized (compact) and sturdy (firm) package configuration is provided. Therefore, a sensor unit 100E which allows a broad range of installation place options and has excellent durability can be provided.

Moreover, as the joining member 10, a silicone rubber packing with excellent airtightness is used. Therefore, the joining member 10 not only bonds the first joining surface 6 of the outer case 1*e* and the second joining surface 22 of the inner case 20 but also secures airtightness on the ring-shaped joining surface. Also, since an adhesive is applied to the perimeter of the connector 16 without any gap, airtightness is secured also in the opening part 21 of the inner case 20. With these configurations, airtightness (waterproofness) from the outside is secured inside the sensor unit 100. Thus, the internal environment of the sensor unit 100E is less susceptible to the influence of the external environment and can constantly perform measurement of inertial forces in a substantially constant stable environment. In other words, environmental conditions to be used are broadened.

Thus, a sensor unit 100E which can be used under abroad range of environmental conditions and has high reliability can be provided. Also, airtightness can be similarly secured even in the case where other materials are used for the above joining member 10.

Also, since the substrate 15 is bonded to the inner case 20 with an adhesive which is elastic (flexible) in the solidified state, this adhesive, too, functions as a vibration-proof member and buffer member which restrains noise vibrations from the inner case 20 to the substrate 15.

Therefore, since the adhesive on the substrate, in addition to the joining member 10, functions as a vibration-proof member and buffer member, noise vibrations can be reduced more effectively.

Thus, a sensor unit 100E with higher reliability and stable detection accuracy can be provided.

Modification 7 In the above Embodiment 2, the configuration in which the through-hole part 90 or a groove part is provided in the substrate 15' in order to realize an appropriate amount of the filling member 50 filling the space of the recessed part 31 and to facilitate the control of the amount of the filling member provided in the manufacturing process is described. However, without being limited to this, a configuration in which a space for accommodating an excess part of the filling member 50 is provided on the side of the inner case 20 where the recessed part 31 is formed may be employed.

Figure 23:
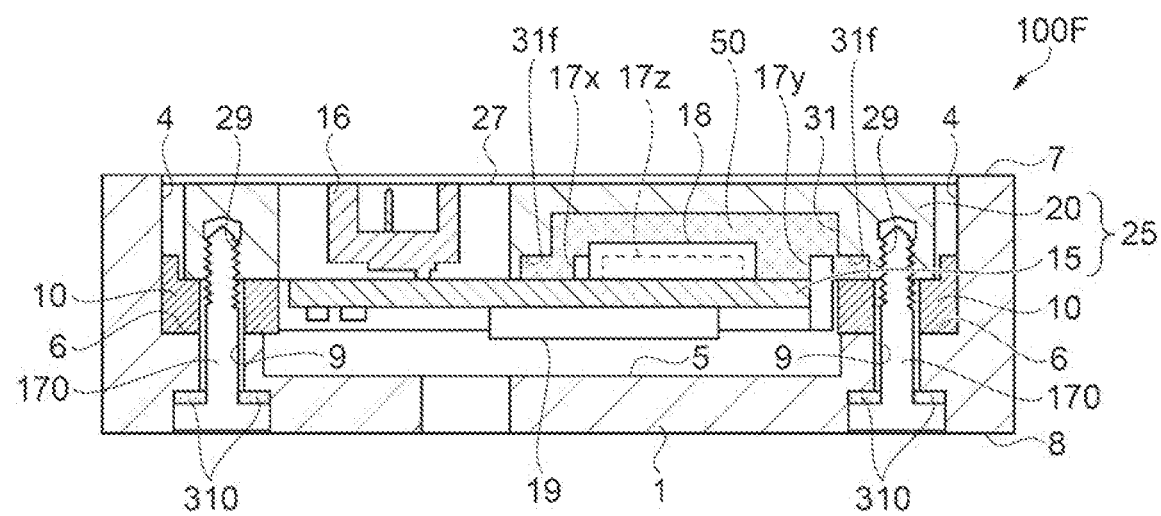
FIG. 23 is a cross-sectional view showing an example of a sensor unit according to Modification 7.

FIG. 23 is a cross-sectional view showing a sensor unit according to Modification 7. Hereinafter, an example of a structure that enables the amount of the filling member provided to be controlled appropriately on the side of the inner case 20 will be described. The same component sites as in the embodiments are denoted by the same numbers and duplicate explanation is omitted.

In a senor unit 100F in this modification shown in FIG. 23, a shelf part 31*f* higher than the recessed bottom surface of the recessed part 31 in the direction of thickness of the inner case 20 is formed at a part of the peripheral edge of the recessed part 31 of the inner case 20 (in FIG. 23, the recessed bottom surface of the recessed part 31 is situated above and the shelf part is situated below the recessed bottom part). In this modification, as viewed in a plan view of the sensor unit 100F, the shelf part 31*f* is formed along the side closer to the connector 16, of the recessed part 31, and the opposite side. However, without being limited to this, the shelf part 31*f* may be formed along one of these sides, or a shelf part may be provided along another side. It can also be said that the shelf part 31*f* is a step formed at a part of the peripheral edge of the recessed part 31 of the inner case 20, or a shallow area of the recessed part 31.

The shelf part 31*f* formed at a part of the peripheral edge of the recessed part 31 may be preferably arranged more toward the center of the substrate 15 than at least one inertial sensor as viewed in a plan view of the substrate 15, and more preferably, may be situated on the other side of the inertial sensors from a communication path which communicates the side of inner case 20 and the side of the outer case 1, in the space formed by the recessed part 31 and the substrate 15. Thus, when the substrate 15 with the inertial sensors and the like mounted thereon is installed after the filling member 50 is put in the recessed part 31 provided with the shelf part 31*f*, the filling member 50 moves also to the shelf part 31*f* as well as to the communication path, which is a release part of the space. Therefore, the filling member 50 can be evenly spread throughout the space formed by the substrate 15 and the recessed part 31.

According to this configuration, when the filling member 50 provided to fill the space formed by the substrate 15 and the recessed part 31 becomes greater than the capacity of the space, the excess part of the filling member 50 is accommodated on the shelf part provided at the peripheral edge part of the recessed part 31. Thus, the excess adhesive can be restrained from overflowing to unwanted sites, and a sensor unit in which the amount of the filling member 50 filling the recessed part 31 can be easily controlled in the manufacturing process can be provided.

Figure 24:
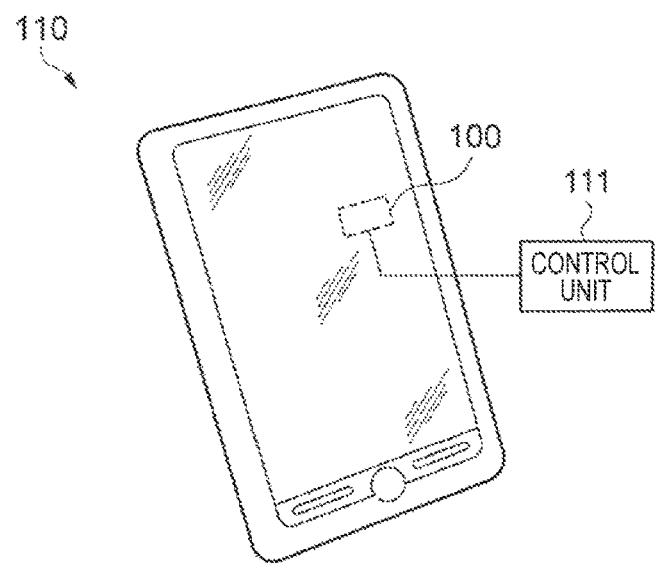
FIG. 24 is an external view showing an example of an electronic apparatus.

Electronic Apparatus FIG. 24 is an external view showing a smartphone as an example of an electronic apparatus.

In a smartphone 110, the above-described sensor unit 100, 100B, 100C is incorporated. Detection data detected by the sensor unit 100, 100B, 100C is transmitted to a control unit 111 of the smartphone 110. The control unit 111 is configured including a CPU (central processing unit) and recognizes the attitude and behavior of the smartphone 110 from the received detection data and thus can change a display image, issue a warning sound or sound effect, and drive a vibration motor to vibrate the main body. In other words, the control unit 111 performs motion sensing of the smartphone 110 and can change display contents or generate a sound, vibration or the like, on the basis of the measured attitude and behavior. Particularly, in the case of executing a game application, the user can experience a sense of being at the site that is close to reality.

Figure 25:
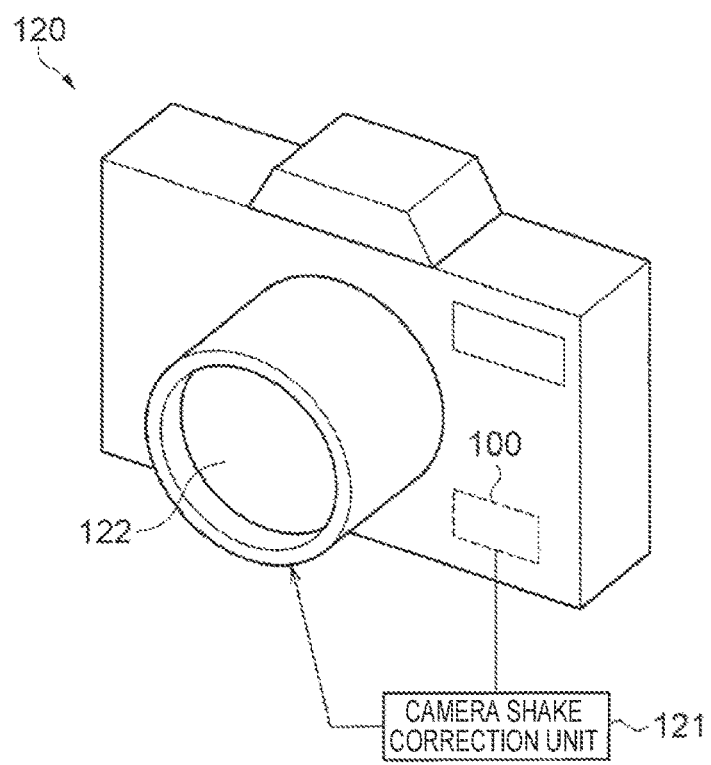
FIG. 25 is an external view showing an example of an electronic apparatus.
Figure 26:
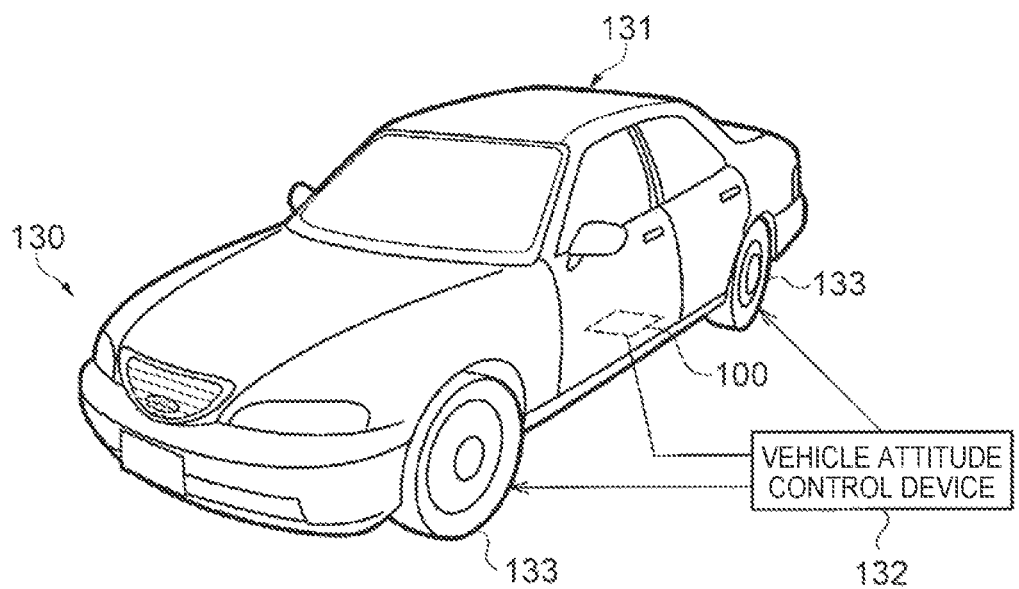
FIG. 26 is an external view showing an example of a moving body.
Figure 27:
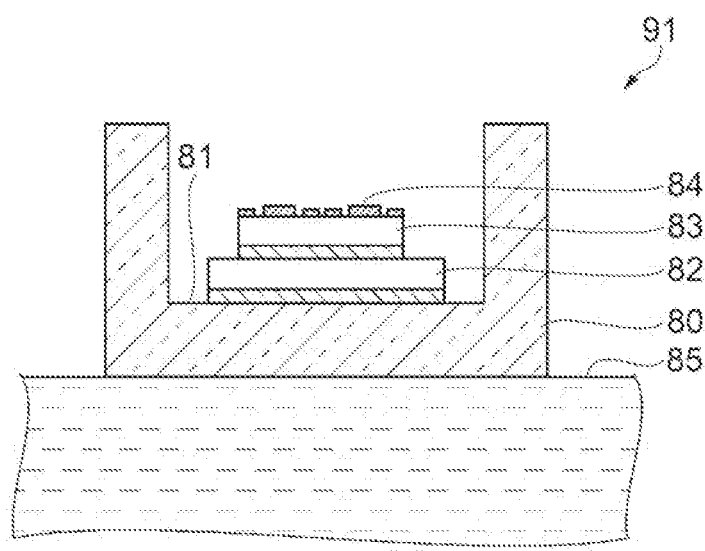
FIG. 27 is a cross-sectional view showing a traditional package configuration.
Figure 28:
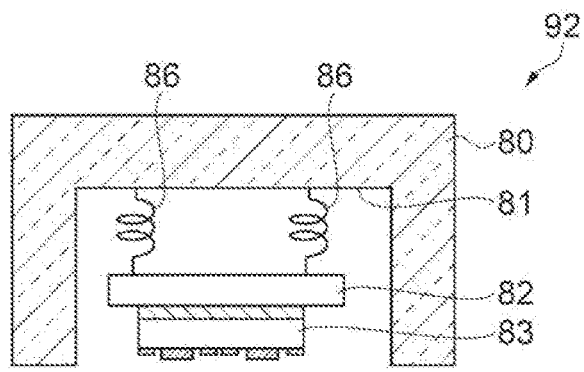
FIG. 28 is a cross-sectional view showing an example of a traditional package configuration.
Figure 29:
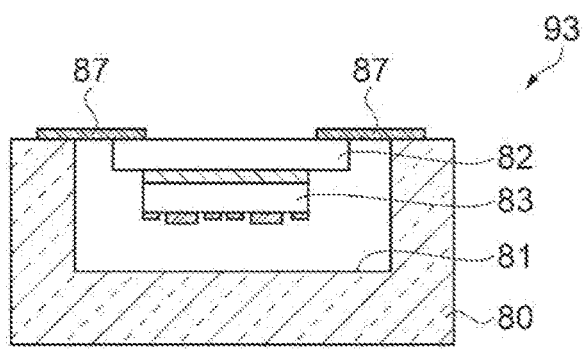
FIG. 29 is a cross-sectional view showing an example of a traditional package configuration.
Figure 30:
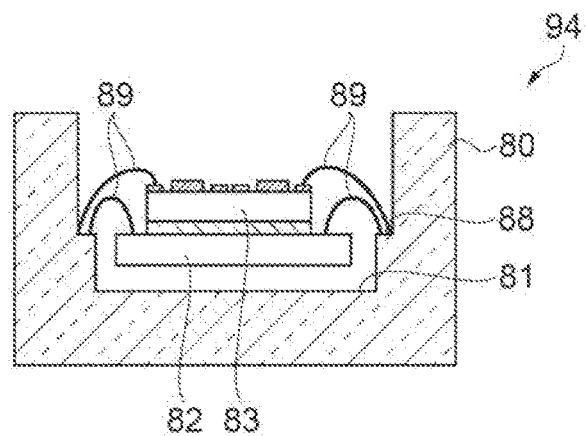
FIG. 30 is a cross-sectional view showing an example of a traditional package configuration.

FIG. 25 is an external view of a digital camera as an example of an electronic apparatus.

In a digital camera 120, the above-described sensor unit 100, 100B, 100C is incorporated. Detection data detected by the sensor unit 100, 100B, 100C is transmitted to a control unit (not illustrated) of the digital camera 120. The control unit is configured including a CPU, detects the attitude of the digital camera 120 from the received detection data, and transmits a control signal based on the result of the detection to a camera shake correction device 121. The camera shake correction device 121 moves a specific lens in a lens set 122 in response to the control signal and thus performs camera shake correction.

However, without being limited to the smartphone and digital camera, the sensor unit 100, 100B, 100C can be similarly incorporated in various electronic apparatuses such as a mobile phone, portable game machine, game controller, car navigation system, pointing device, head-mounted display, and tablet personal computer, and similar effects can be achieved.

Moving Body FIG. 16 is an external view of an automobile 130 as an example of a moving body.

In the automobile 130, the above-described sensor unit 100, 100B, 100C is incorporated. Detection data detected by the sensor unit 100, 100B, 100C is transmitted to a vehicle attitude control device 132 of the automobile 130. The vehicle attitude control device 132 is configured including a CPU, and detects the attitude and behavior of the automobile 130 from the received detection data and transmits a control signal based on the result of the detection to a brake controller and a suspension controller for wheels 133. For example, in the case where an attitude or behavior that is recognized as a skid is detected when a sudden steering operation is carried out or during traveling on a slippery road surface, the brake controller applies braking on each wheel 133 in response to the control signal and thereby corrects the traveling direction of the vehicle and controls the vehicle to maintain the initial traveling direction. In other words, braking is performed to maintain the traveling direction of the vehicle.

Also, without being limited to the automobile, the sensor unit 100, 100B, 100C can be similarly incorporated in various moving bodies such as a two-wheeled vehicle, civil engineering and construction machine, agricultural machine, heavy machine for farm, unmanned vehicle, aircraft, helicopter, mini-submarine, and robot, and similar effects can be achieved.

The embodiments of the invention made by the inventor have been specifically described above. However, the invention is not limited to the above embodiments and various changes can be made without departing from the scope of the invention.

For example, in the embodiments, the respective inertial sensors (17x, 17y, 17z, 18) and other electronic elements mounted on the substrate 15 are configured to be mounted on the surface on the side of the recessed part 31, of the substrate 15, so that these components are arranged in the space of the recessed part 31 formed by the substrate 15 and the recessed part 31. Also, it is described that having as large parts as possible of the respective inertial sensors (17x, 17y, 17z, 18) and other electronic elements or the like arranged in the space of the recessed part 31, in the state of being covered with the filling member 50, is desirable.

Without being limited to this, the effects of the invention can be achieved as long as the substrate 15 and the inner case 20 are fixed together in such a way as to secure a predetermined strength or above, with the filling member 50 filling the space of the recessed part 31. Therefore, the respective inertial sensors and other electronic elements may be configured to be arranged on the opposite surface of the substrate 15 (surface opposite to the surface facing the recessed part 31).

Also, in the embodiments, the joining member 10 provided between the outer case 1 and the inner case 20 of the sensor module 25 is arranged in such a way as to come in contact with the first joining surface 6 as a part of the bottom wall 5 of the outer case 1 and also in contact with the side wall 4 rising from the first joining surface 6 (bottom wall 5). Without being limited to this, the joining member 10 may be arranged in such a way as to come in contact with the bottom wall 5 of the outer case 1 and the first joining surface 6, which is a part of the bottom wall 5, as long as the sensor module 25 can be fixed with a gap secured so as not to come in contact with the side wall 4 of the outer case 1.

Also, in the embodiments, the example in which, in the sensor unit 100, the top surface 7 of the outer case 1 which comes in contact with the installation target surface 71 when installed on the installation target surface 71 of an external device or the like is in the same frame shape, is illustrated. Without being limited to this, it suffices that the contact part of the outer case 1 with the installation target surface 71 can be fixed to the installation target surface 71 to such an extent as to cause no trouble in the sensor unit 100. For example, a contact surface split into a plurality of surfaces may be employed.

What is claimed is:
1. A sensor unit comprising:
three mutually orthogonal axes being defined as an X-axis, a Y-axis, and a Z-axis;
a substrate having first and second surfaces opposite to each other and first and second sides, the first and second surfaces extending orthogonal to the Z-axis, the first side extending perpendicular to the X-axis, the second side extending orthogonal to the Y-axis;
a first gyro sensor disposed on the first side of the substrate, the first gyro sensor being configured to detect an angular velocity in a direction along the X-axis;
a second gyro sensor disposed on the second side of the substrate, the second gyro sensor being configured to detect an angular velocity in a direction along the Y-axis;
a third gyro sensor disposed on the first surface of the substrate, the third gyro sensor being configured to detect an angular velocity in a direction along the Z-axis;
an acceleration sensor disposed on the first surface of the substrate, the acceleration sensor being configured to detect accelerations along the X-axis, the Y-axis, and the Z-axis;
a connector having first and second parts, the first part of the connector being disposed on the first surface of the substrate;
an inner case having an exposed surface exposed to an outside of the sensor unit, the exposed surface extending orthogonal to the Z-axis, the inner case being mounted on the substrate so as to face the first surface of the substrate; and
an outer case having a first opening, a bottom wall, and a side wall, the first opening being opened toward a direction along the Z-axis, the side wall contacting the bottom wall,
wherein the inner case is housed in a first space that is formed by the first opening, the bottom wall, and the side wall of the outer case, and the inner case is disposed on the bottom wall of the outer case via an elastic member,
the exposed surface of the inner case is exposed through the first opening of the outer case, and
the second part of the connector faces toward a direction along the Z-axis.

2. The sensor unit according to claim 1, further comprising:
- a control IC disposed on the second surface of the substrate, the control IC being configured to control the first gyro sensor, the second gyro sensor, the third gyro sensor, and the acceleration sensor.

3. The sensor unit according to claim 1,
wherein the inner case has a second opening, and the second opening is opened toward a direction along the Z-axis, and
the second part of the connector is exposed through the second opening.

4. The sensor unit according to claim 1,
wherein an elastic modulus of the elastic member is smaller than an elastic modulus of the outer case.

5. The sensor unit according to claim 1,
wherein the bottom wall has a joining surface extending orthogonal to the Z-axis,
the outer case also has a bottom surface,
the joining surface is located closer to the inner case than the bottom surface of the outer case, and
the elastic member is disposed on the joining surface.

6. The sensor unit according to claim 1,
wherein the elastic member abuts against the side wall of the outer case.

7. The sensor unit according to claim 1,
wherein the inner case has a recess facing the first surface of the substrate, and
the first gyro sensor, the second gyro sensor, the third gyro sensor, and the acceleration sensor are positioned in a second space that is surrounded by the substrate and the recess.

8. The sensor unit according to claim 7,
wherein one of a groove or a through-hole is formed in an area of the substrate overlapping with the recess as viewed in a direction along the Z-axis.

9. The sensor unit according to claim 7,
wherein a filling member fills the second space surrounded by the substrate and the recess, and
the first gyro sensor, the second gyro sensor, the third gyro sensor, and the acceleration sensor are covered by the filling member.

10. The sensor unit according to claim 9,
wherein one of a groove or a through-hole is formed in an area of the substrate overlapping with the recess as viewed in a direction along the Z-axis.

11. An electronic apparatus comprising:
the sensor unit according to claim 1.

12. An electronic apparatus comprising:
the sensor unit according to claim 2.

13. An electronic apparatus comprising:
the sensor unit according to claim 3.

14. An electronic apparatus comprising:
the sensor unit according to claim 4.

15. An electronic apparatus comprising:
the sensor unit according to claim 5.

16. A moving body comprising:
the sensor unit according to claim 1.

17. A moving body comprising:
the sensor unit according to claim 2.

18. A moving body comprising:
the sensor unit according to claim 3.

19. A moving body comprising:
the sensor unit according to claim 4.

20. A moving body comprising:
the sensor unit according to claim 5.

* * * * *